(12) United States Patent
Xiao

(10) Patent No.: US 12,432,905 B2
(45) Date of Patent: Sep. 30, 2025

(54) SEMICONDUCTOR DEVICE STRUCTURE HAVING CHANNEL LAYER WITH REDUCED APERTURE AND METHOD FOR MANUFACTURING THE SAME

(71) Applicant: NANYA TECHNOLOGY CORPORATION, New Taipei (TW)

(72) Inventor: Yu Xiao, Taichung (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 576 days.

(21) Appl. No.: 17/821,464

(22) Filed: Aug. 22, 2022

(65) Prior Publication Data

US 2024/0064961 A1  Feb. 22, 2024

(51) Int. Cl.
  *H10B 12/00* (2023.01)

(52) U.S. Cl.
  CPC .......... *H10B 12/312* (2023.02); *H10B 12/03* (2023.02); *H10B 12/482* (2023.02); *H10B 12/488* (2023.02)

(58) Field of Classification Search
  CPC .... H10B 12/312; H10B 12/03; H10B 12/482; H10B 12/488; H10B 12/036; H10B 12/05; H10B 12/33; H10B 12/30; H10B 12/31; H10B 12/318; H10B 12/373; H10B 12/39; H10B 12/395
  See application file for complete search history.

(56) References Cited

U.S. PATENT DOCUMENTS

| | | | | |
|---|---|---|---|---|
| 5,627,390 A | * | 5/1997 | Maeda | H10D 86/01 257/302 |
| 9,698,272 B1 | * | 7/2017 | Ikeda | H10D 86/481 |
| 10,790,396 B2 | * | 9/2020 | Sawabe | H10D 30/477 |
| 10,847,516 B2 | * | 11/2020 | Mathew | H10B 12/00 |
| 11,386,950 B2 | * | 7/2022 | Park | H10B 12/33 |
| 11,417,662 B2 | * | 8/2022 | Tsai | H10B 12/33 |
| 11,978,806 B2 | * | 5/2024 | Tajima | H10D 30/6755 |
| 12,137,550 B2 | * | 11/2024 | Xiao | H10D 30/6755 |
| 12,261,221 B2 | * | 3/2025 | Sakuma | H10D 30/6755 |

FOREIGN PATENT DOCUMENTS

| | | |
|---|---|---|
| TW | 201535686 A | 9/2015 |
| TW | 202133390 A | 9/2021 |
| TW | 202209636 A | 3/2022 |

* cited by examiner

*Primary Examiner* — Eduardo A Rodela
(74) *Attorney, Agent, or Firm* — MUNCY, GEISSLER, OLDS & LOWE, P.C.

(57) ABSTRACT

A semiconductor device structure and method for manufacturing the same are provided. The semiconductor device structure includes a substrate, a word line, a channel layer, and a bit line. The word line is disposed on the substrate. The channel layer is surrounded by the word line. The bit line is disposed on the channel layer. The channel layer has a first portion in the substrate and a second portion over the substrate. A first width of the first portion is greater than a second width of the second portion along a first direction.

20 Claims, 21 Drawing Sheets

SEMICONDUCTOR DEVICE STRUCTURE HAVING CHANNEL LAYER WITH REDUCED APERTURE AND METHOD FOR MANUFACTURING THE SAME

TECHNICAL FIELD

The present disclosure relates to a semiconductor device structure and method of manufacturing the same, and in particularly to a semiconductor device structure including a channel layer with reduced aperture.

DISCUSSION OF THE BACKGROUND

With the rapid growth of the electronics industry, the development of integrated circuits (ICs) has achieved high performance and miniaturization. Technological advances in IC materials and design have produced generations of ICs where each generation has smaller and more complex circuits than the previous generation.

A Dynamic Random Access Memory (DRAM) device is a type of random access memory that stores each bit of data in a separate capacitor within an integrated circuit. Typically, a DRAM is arranged in a square array of one capacitor and transistor per cell. A vertical transistor has been developed for the $4F^2$ DRAM cell, where F stands for the photolithographic minimum feature width or critical dimension (CD). However, recently, DRAM manufacturers face the tremendous challenge of shrinking the memory cell area as the word line spacing continues to shrink. For example, the channel of a bit line is prone to be in contact with a word line, thereby inducing a short due to an overlay error of a lithography process.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device structure. The semiconductor device structure includes a substrate, a word line, a channel layer, and a bit line. The word line is disposed on the substrate. The channel layer is surrounded by the word line. The bit line is disposed on the channel layer. The channel layer has a first portion in the substrate and a second portion over the substrate. A first width of the first portion is greater than a second width of the second portion along a first direction.

Another aspect of the present disclosure provides another semiconductor device structure. The semiconductor device structure includes a substrate, a word line, a bit line, a channel layer, and an aperture adjustment component. The word line is disposed on the substrate. The bit line is disposed on the word line and physically spaced apart from the word line. The channel layer extends between the substrate and the bit line. The aperture adjustment component is disposed between the word line and the bit line. The aperture adjustment component has a sidewall substantially coplanar with a sidewall of the word line.

Another aspect of the present disclosure provides a method for manufacturing a semiconductor device structure. The method includes: providing a substrate; forming a first portion of the channel layer in the substrate; forming a word line over the substrate; forming a patterned mask structure over the word line, wherein the patterned mask structure defines a first recess with a first aperture, wherein the first recess is vertically aligned to the first portion of a channel layer; forming an aperture adjustment component covering the patterned mask structure, wherein the aperture adjustment component defines a second recess with a second aperture smaller than the first aperture; performing an etching process to form a trench defined by the word line; and forming a second portion of the channel layer within the trench.

The embodiments of the present disclosure provide a semiconductor device structure with a channel layer physically spaced apart from the word line. An aperture adjustment component can be utilized to assist in preventing electrical shorts between the channel layer and the word line, while the size of the channel layer can be reduced. As a result, the performance of the semiconductor device structure can be improved.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
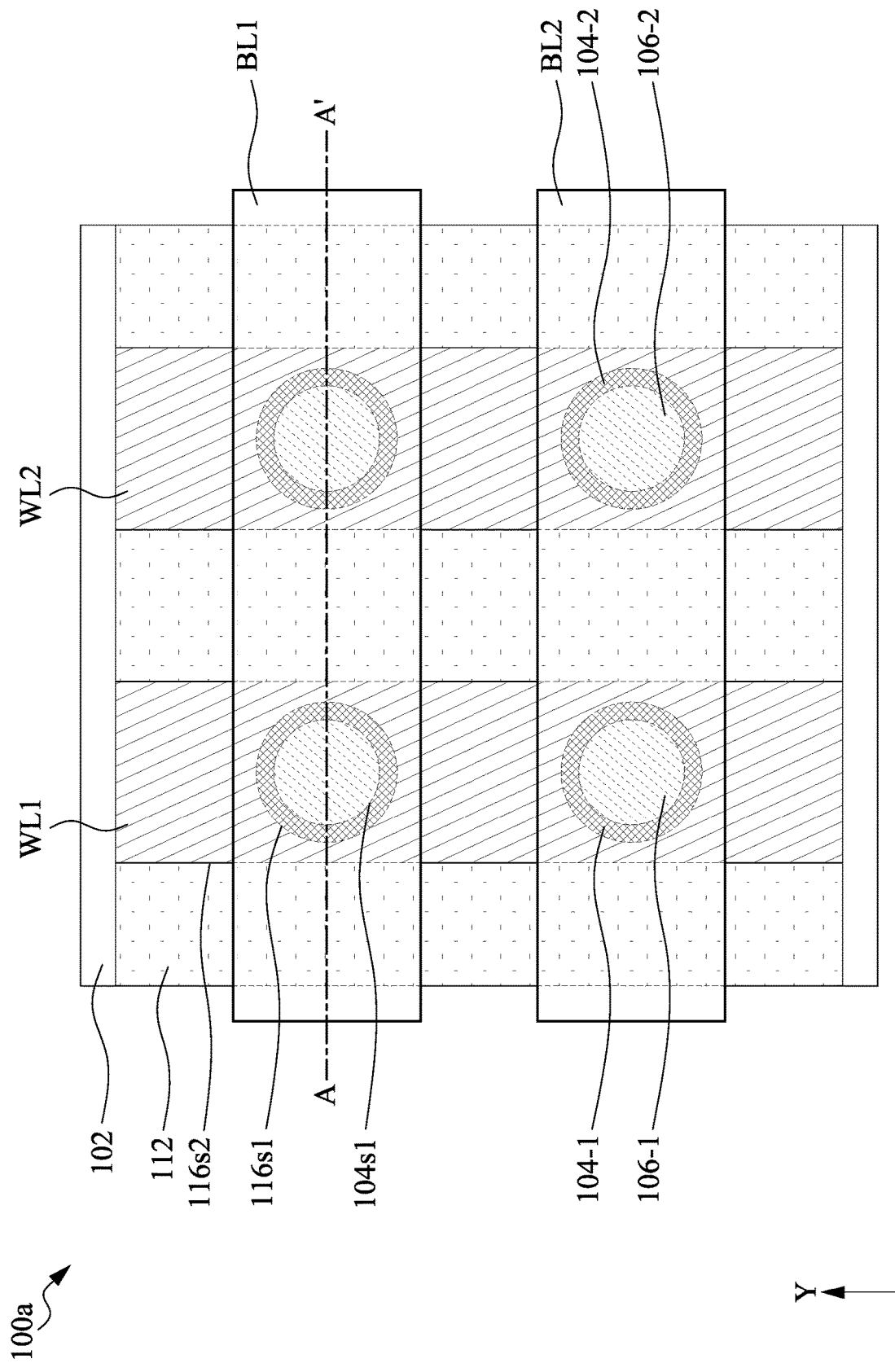
FIG. 1A is a top view of a layout of a semiconductor device structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1A is a top view of a layout of a semiconductor device structure 100a, in accordance with some embodiments of the present disclosure.

In some embodiments, the semiconductor device structure 100a may include semiconductor devices, which can include active components and/or passive components. The active component may include a memory device (e.g., dynamic random access memory (DRAM) device, a static random access memory (SRAM) device, etc.)), a power management device (e.g., power management integrated circuit (PMIC) device)), a logic device (e.g., system-on-a-chip (SoC), central processing unit (CPU), graphics processing unit (GPU), application processor (AP), microcontroller, etc.)), a radio frequency (RF) device, a sensor device, a micro-electro-mechanical-system (MEMS) device, a signal processing device (e.g., digital signal processing (DSP) device)), a front-end device (e.g., analog front-end (AFE) devices)) or other active components. The passive component may include a capacitor, a resistor, an inductor, a fuse or other passive components.

In some embodiments, the semiconductor device structure 100a can be applied to a memory, memory device, memory die, memory chip or other components. The semiconductor device structure 100a can be a portion of memory, memory device, memory die, or memory chip. For example, the memory can be a DRAM. In some embodiments, the DRAM can be a double data rate fourth generation (DDR4) DRAM. In some embodiments, the memory includes one or more memory cells (or memory bits, memory blocks).

As shown in FIG. 1A, the semiconductor device structure 100a can include a substrate 102, a plurality of word lines WL1 and WL2, a plurality of bit lines BL1 and BL2, a plurality of gate dielectric layers 104-1 and 104-2, a plurality of channel layers 106-1 and 106-2, as well as a dielectric layer 112.

Each of the word lines WL1 and WL2 can extend along the Y-axis. Each of the word lines WL1 and WL2 can be parallel to each other. In some embodiments, each of the word lines WL1 and WL2 can be physically separated from each other. The word lines WL1 and WL2 can include conductive materials, such as tungsten (W), copper (Cu), aluminum (Al), tantalum (Ta), molybdenum (Mo), tantalum nitride (TaN), titanium, titanium nitride (TiN), the like, and/or a combination thereof.

Each of the bit lines BL1 and BL2 can extend along the X-axis. Each of the bit lines BL1 and BL2 can be parallel to each other. Each of the bit lines BL1 and BL2 can be physically separated from each other. In some embodiments, the bit lines BL1 and BL2 can be located at a horizontal level higher than that of the word lines WL1 and WL2. The bit lines BL1 and BL2 can include conductive materials, such as tungsten, copper, aluminum, tantalum, tantalum nitride, titanium, titanium nitride, the like, and/or a combination thereof.

In some embodiments, the gate dielectric layers 104-1 and 104-2 can be disposed on a sidewall of the word line. In some embodiments, each of the gate dielectric layers 104-1 and 104-2 can be disposed on a sidewall 116s1 of the word line WL1. In some embodiments, the gate dielectric layers 104-1 and 104-2 can be embedded in the word line WL1 or WL2. In some embodiments, the gate dielectric layers 104-1 and 104-2 can be surrounded by the word line WL1 or WL2. In some embodiments, the gate dielectric layers 104-1 and 104-2 can be completely surrounded by the sidewall 116s1 of the word line WL1 or WL2.

In some embodiments, each of the gate dielectric layers 104-1 and 104-2 can overlap the bit line BL1 or BL2 along the Z-axis.

In some embodiments, the gate dielectric layers 104-1 and 104-2 can include silicon oxide ($SiO_x$), silicon nitride ($Si_xN_y$), silicon oxynitride (SiON), or a combination thereof. In some embodiments, the gate dielectric layer can include dielectric material(s), such as high-k dielectric material. The high-k dielectric material may have a dielectric constant (k value) greater than 4. The high-k material may include hafnium oxide (HfO$_2$), zirconium oxide (ZrO$_2$), lanthanum oxide (La$_2$O$_3$), yttrium oxide (Y$_2$O$_3$), aluminum oxide (Al$_2$O$_3$), titanium oxide (TiO$_2$) or another applicable material. Other suitable materials are within the contemplated scope of this disclosure. In some embodiments, the gate dielectric layers 104-1 and 104-2 can include a circle profile, an oval profile, an ellipse profile, or the like.

In some embodiments, each of the channel layers 106-1 and 106-2 can be disposed on a sidewall of the word line. In some embodiments, the channel layers 106-1 can be disposed on a sidewall 116s1 of the word line WL1. In some embodiments, each of the channel layers 106-1 and 106-2 can be disposed on a sidewall 104s1 of the gate dielectric layers 104-1 and 104-2, respectively. In some embodiments, each of the channel layers 106-1 and 106-2 can be embedded in the word line WL1 or WL2. In some embodiments, each of the channel layers 106-1 and 106-2 can be surrounded by the word line WL1 or WL2. In some embodiments, each of the channel layers 106-1 and 106-2 can be surrounded by the sidewall 116s1 of the word line WL1 or WL2.

In some embodiments, each of the channel layers 106-1 and 106-2 can be embedded in the gate dielectric layers 104-1 or 104-2. In some embodiments, each of the channel layers 106-1 and 106-2 can be surrounded by the gate dielectric layers 104-1 or 104-2. In some embodiments, each of the channel layers 106-1 and 106-2 can be surrounded by the sidewall 104s1 of the gate dielectric layers 104-1 or 104-2. In some embodiments, each of the channel layers 106-1 and 106-2 can be in contact with the gate dielectric layers 104-1 or 104-2. In some embodiments, each of the channel layers 106-1 and 106-2 can overlap the bit line BL1 or BL2 along the Z-axis. In some embodiments, each of the channel layers 106-1 and 106-2 can be completely surrounded by the gate dielectric layers 104-1 or 104-2 from a top view.

The material of the channel layers 106-1 and 106-2 can include an amorphous semiconductor, a poly-semiconductor and/or metal oxide. The semiconductor can include, but is not limited to, germanium (Ge), silicon (Si), tin (Sn), antimony (Sb). The metal oxide may include, but is not limited to, indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also represented as IGZO), an In—Al—Zn-based oxide, an In—S based oxide (also represented as ITO), an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide, but the present disclosure is not limited in this regard.

In some embodiments, the dielectric layer 112 can be disposed on a sidewall 116s2 of the word line WL1 or WL2. In some embodiments, the dielectric layer 112 can be disposed between the two adjacent word lines. For example, the dielectric layer 112 can be disposed between the word lines WL1 and WL2. In some embodiments, each of the gate dielectric layers 104-1 and 104-2 can be physically spaced apart from the dielectric layer 112. In some embodiments, each of the gate dielectric layers 104-1 and 104-2 can be physically spaced apart from the dielectric layer 112 by the word line WL1 or WL2.

In some embodiments, each of the channel layers 106-1 or 106-2 can be physically spaced apart from the dielectric layer 112. In some embodiments, the channel layer 106-1 or 106-2 can be physically spaced apart from the dielectric layer 112 by the gate dielectric layers 104-1 and 104-2 as well as by the word line WL1 or WL2.

The dielectric layer 112 can include silicon oxide (SiO$_x$), silicon nitride (Si$_x$N$_y$), silicon oxynitride (SiON), or other suitable materials. In some embodiments, the material of the dielectric layer 112 can be different from that of the gate dielectric layers 104-1 and 104-2. In some embodiments, the material of the dielectric layer 112 can be the same as that of the gate dielectric layers 104-1 and 104-2 with different quality or film density.

Figure 1B:
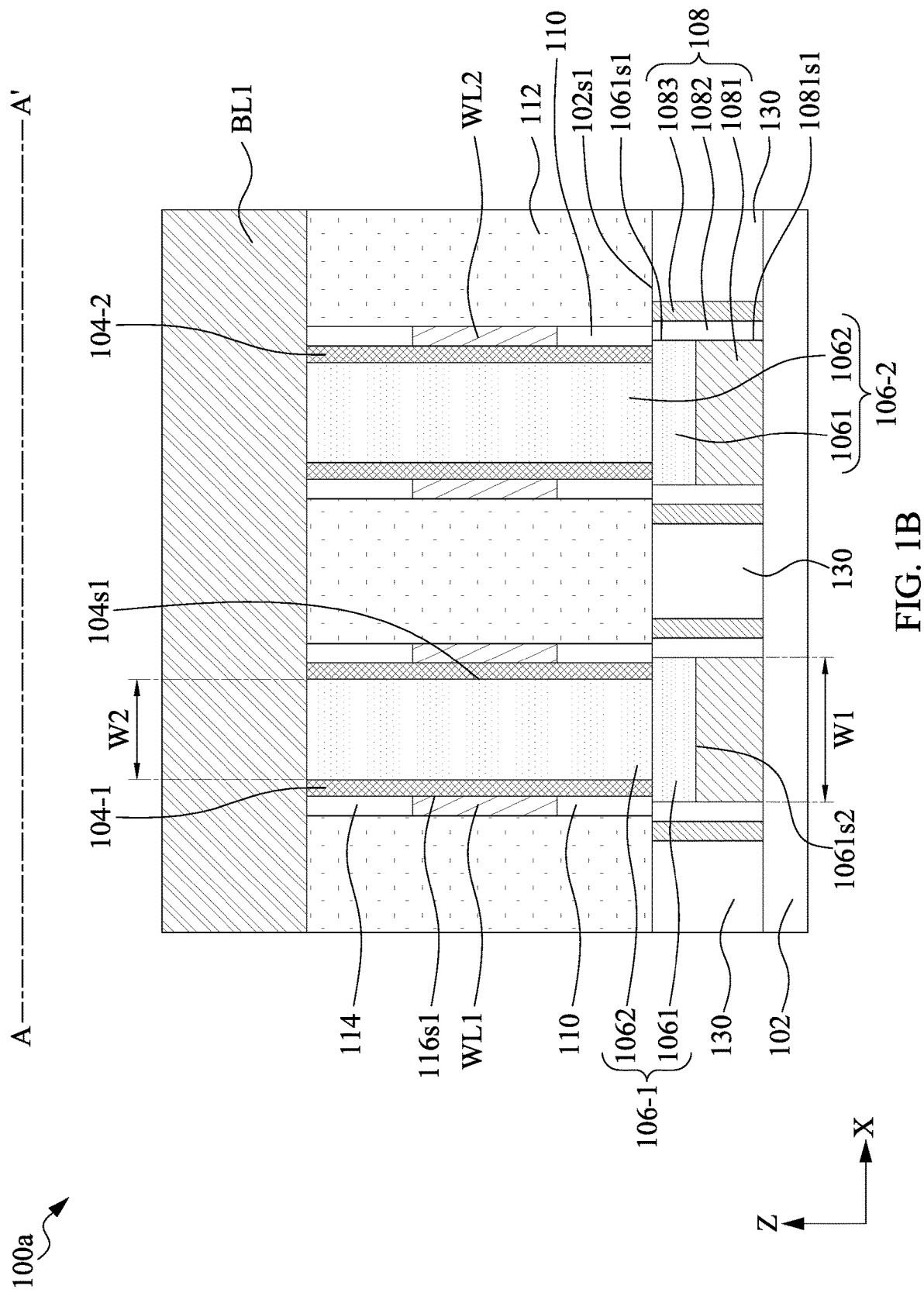
FIG. 1B is a cross-sectional view along line A-A' of the semiconductor device structure as shown in FIG. 1A, in accordance with some embodiments of the present disclosure.

FIG. 1B is a cross-sectional view along line A-A' of the semiconductor device structure 100a as shown in FIG. 1A, in accordance with some embodiments of the present disclosure.

As shown in FIG. 1B, the semiconductor device structure 100a can further include a capacitor structure 108, a dielectric layer 110, a dielectric layer 114, and an isolation structure 130.

The substrate 102 may be a semiconductor substrate, such as a bulk semiconductor, a semiconductor-on-insulator (SOI) substrate, or the like. The substrate 102 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable material; or a combination thereof. In some embodiments, the alloy semiconductor substrate may include a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 102 may have a multilayer structure, or the substrate 102 may include a multilayer compound semiconductor structure.

The substrate 102 can have multiple doped regions (not shown) therein. In some embodiments, p type and/or n type dopants can be doped in the substrate 102. In some embodiments, p type dopants include boron (B), other group III elements, or any combination thereof. In some embodiments, n type dopants include arsenic (As), phosphorus (P), other group V elements, or any combination thereof.

In some embodiments, each of the channel layers 106-1 or 106-2 can include a portion 1061 and a portion 1062 disposed on the portion 1061. The portions 1061 and 1062 of the channel layer 106-1 or 106-2 can be utilized to electrically connect the capacitor structure 108 and the bit line BL1 (or BL2). In some embodiments, the portion 1061 of the channel layer 106-1 or 106-2 can be embedded in the substrate 102. In some embodiments, the portion 1062 of the channel layer 106-1 or 106-2 can be disposed on or over the substrate 102.

The portion 1061 of the channel layer 106-1 or 106-2 can have a width W1 at a top surface 102s1 of the substrate 102. The portion 1062 of the channel layer 106-1 or 106-2 can have a width W2 at the top surface 102s1 of the substrate 102. In some embodiments, the width W1 can be greater than the width W2. In some embodiments, the material of the portion 1061 can be different from that of the portion 1062 of the channel layer 106-1 or 106-2. In some embodiments, the material of the portion 1061 can be the same as that of the portion 1062 of the channel layer 106-1 or 106-2. For example, the portion 1061 can include ITO, and the portion 1062 can include IGZO. The portion 1061 of the channel layer 106-1 or 106-2 can have a surface (or a lateral surface) 1061s1 and a surface (or a bottom surface) 1061s2 substantially perpendicular to the surface 1061s1.

In some embodiments, the capacitor structure 108 can be embedded in the substrate 102. In some embodiments, the portion 1061 of the channel layer 106-1 (or 106-2) can be disposed between the portion 1062 of the channel layer 106-1 (or 106-2) and the capacitor structure 108. In some embodiments, the capacitor structure 108 can include an electrode 1081, an insulation layer 1082, and an electrode 1083. In some embodiments, the capacitor structure 108 can have a circle profile, an oval profile, an ellipse profile, or the like from a top view. In some embodiments, the insulation layer 1082 can surround the electrode 1081. In some embodiments, the electrode 1083 can surround the electrode 1081. In some embodiments, the electrode 1083 can surround the insulation layer 1082. In some embodiments, the insulation layer 1082 can be disposed between the electrodes 1081 and 1083.

In some embodiments, the electrode 1081 can be in contact with a bottom surface 1061s2 of the portion 1061 of the channel layer 106-1 or 106-2. The electrode 1081 can include a semiconductor material or a conductive material. The semiconductor material can include polysilicon or other suitable materials. The conductive material can include tungsten, copper, aluminum, tantalum, or other suitable materials. The electrode 1081 can have a surface (or a lateral surface) 1081s1 in contact with the insulation layer 1082. In some embodiments, the surface 1081s1 of the electrode 1081 can be coplanar with the surface 1061s1 of the portion 1061 of the channel layer 106-1 or 106-2. In some embodiments, the electrode 1081 of the capacitor structure 108 can overlap the gate dielectric layers 104-1 or 104-2 along the Z-axis. In some embodiments, the electrode 1081 of the capacitor structure 108 can overlap the word line WL1 or WL2 along the Z-axis. In some embodiments, the electrode 1081 of the capacitor structure 108 can partially overlap the word line WL1 or WL2 along the Z-axis. In some embodiments, a portion of the word line WL1 or WL2 can be free from overlapping the electrode 1081 of the capacitor structure 108 along the Z-axis.

In some embodiments, the insulation layer 1082 can be disposed on the sidewall 1081s1 of the electrode 1081. In some embodiments, the insulation layer 1082 can be in contact with the surface 1061s1 of the portion 1061 of the channel layer 106-1 or 106-2. In some embodiments, the insulation layer 1082 can overlap the portion 1061 of the channel layer 106-1 or 106-2 along the X-axis. In some embodiments, the insulation layer 1082 can be exposed from the surface 102s1 of the substrate 102. In some embodiments, the insulation layer 1082 can be free from overlapping the gate dielectric layers 104-1 and 104-2 along the Z-axis. In some embodiments, the insulation layer 1082 can be free from overlapping the portion 1062 of the channel layer 106-1 or 106-2 along the Z-axis. In some embodiments, the insulation layer 1082 can partially overlap the word line WL1 or WL2 along the Z-axis. The insulation layer 1082 can include dielectric materials, such as silicon oxide, tungsten oxide, zirconium oxide, copper oxide, aluminum oxide, hafnium oxide, or the like.

In some embodiments, the electrode 1083 can overlap the portion 1061 of the channel layer 106-1 or 106-2 along the X-axis. In some embodiments, the electrode 1083 of the capacitor structure 108 can be exposed from the top surface 102s1 of the substrate 102. In some embodiments, the electrode 1083 can be free from overlapping the gate dielectric layers 104-1 and 104-2 along the Z-axis. In some embodiments, the electrode 1083 can be free from overlapping the portion 1062 of the channel layer 106-1 or 106-2 along the Z-axis. In some embodiments, the electrode 1083 can be free from overlapping the word line WL1 or WL2 along the Z-axis.

The electrode 1083 can include a semiconductor material or a conductive material. The semiconductor material can include polysilicon or other suitable materials. The conductive material can include tungsten, copper, aluminum, tantalum, or other suitable materials. In some embodiments, the material of the electrode 1081 can be different from that of the electrode 1083. In some embodiments, the material of the electrode 1081 can be the same as that of the electrode 1083.

The isolation feature 130 can be embedded in the substrate 102. The isolation feature 130 can be disposed between the capacitor structures 108. The isolation structure 130 can include a dielectric material such as silicon oxide, silicon nitride, silicon oxy-nitride, fluoride-doped silicate (FSG), a low-k dielectric material, combinations thereof, and/or other suitable materials.

The dielectric layer 110 can be disposed on the substrate 102. The dielectric layer 110 can include silicon oxide ($SiO_x$), silicon nitride ($Si_xN_y$), silicon oxynitride (SiON), phosphosilicate glass (PSG), borophosphosilicate glass (BPSG), a low-k dielectric material (k<4), or other suitable materials. In some embodiments, the word lines WL1 and WL2 can be disposed on the dielectric layer 110.

The dielectric layer 114 can be disposed on the word lines WL1 and WL2. The dielectric layer 114 can include silicon oxide ($SiO_x$), silicon nitride ($Si_xN_y$), silicon oxynitride (SiON), phosphosilicate glass (PSG), borophosphosilicate glass (BPSG), a low-k dielectric material (k<4), or other suitable materials. In some embodiments, the bit lines (e.g., BL1) can be disposed on the dielectric layer 114.

In some embodiments, each of the gate dielectric layers 104-1 and 104-2 can penetrate the dielectric layer 114. In some embodiments, each of the gate dielectric layers 104-1 and 104-2 can penetrate the dielectric layer 110. In some embodiments, each of the channel layers 106-1 and 106-2 can penetrate the dielectric layer 114. In some embodiments, each of the channel layers 106-1 and 106-2 can penetrate the dielectric layer 110.

In some embodiments, a word line (e.g., WL1 or WL2), gate dielectric layers 104-1 or 104-2, and a channel layer 106-1 or 106-2 can be included in a transistor. During a read operation, a word line (e.g., WL1 or WL2) can be asserted, turning on a transistor. The enabled transistor allows the voltage across a capacitor (e.g., capacitor structure 108) to be read by a sense amplifier through a bit line (e.g., BL1 or BL2). During a write operation, the data to be written can be provided on the bit line (e.g., BL1 or BL2) when the word line (e.g., WL1 or WL2) is asserted.

In this embodiment, the width W2 of the portion 1602 is less than the width W1 of the portion 1061 of the channel 106-1 or 106-2. In this embodiment, the channel 106-1 or 106-2 can be physically spaced apart from the word line WL1 or WL2 by using an aperture adjustment component, which will be described in detail later. The aforesaid aperture adjustment component can be utilized to reduce the aperture accommodating the gate dielectric layers 104-1 and 104-2 as well as the channel layer 106-1 or 106-2, reducing the size of the gate dielectric layers 104-1 and 104-2 as well as the portion 1062 of channel layers 106-1 and 106-2. As a result, electrical shorts can be prevented when a high external voltage is imposed on the word line WL1 or WL2, thereby improving the performance of the semiconductor device structure 100a.

Figure 2:
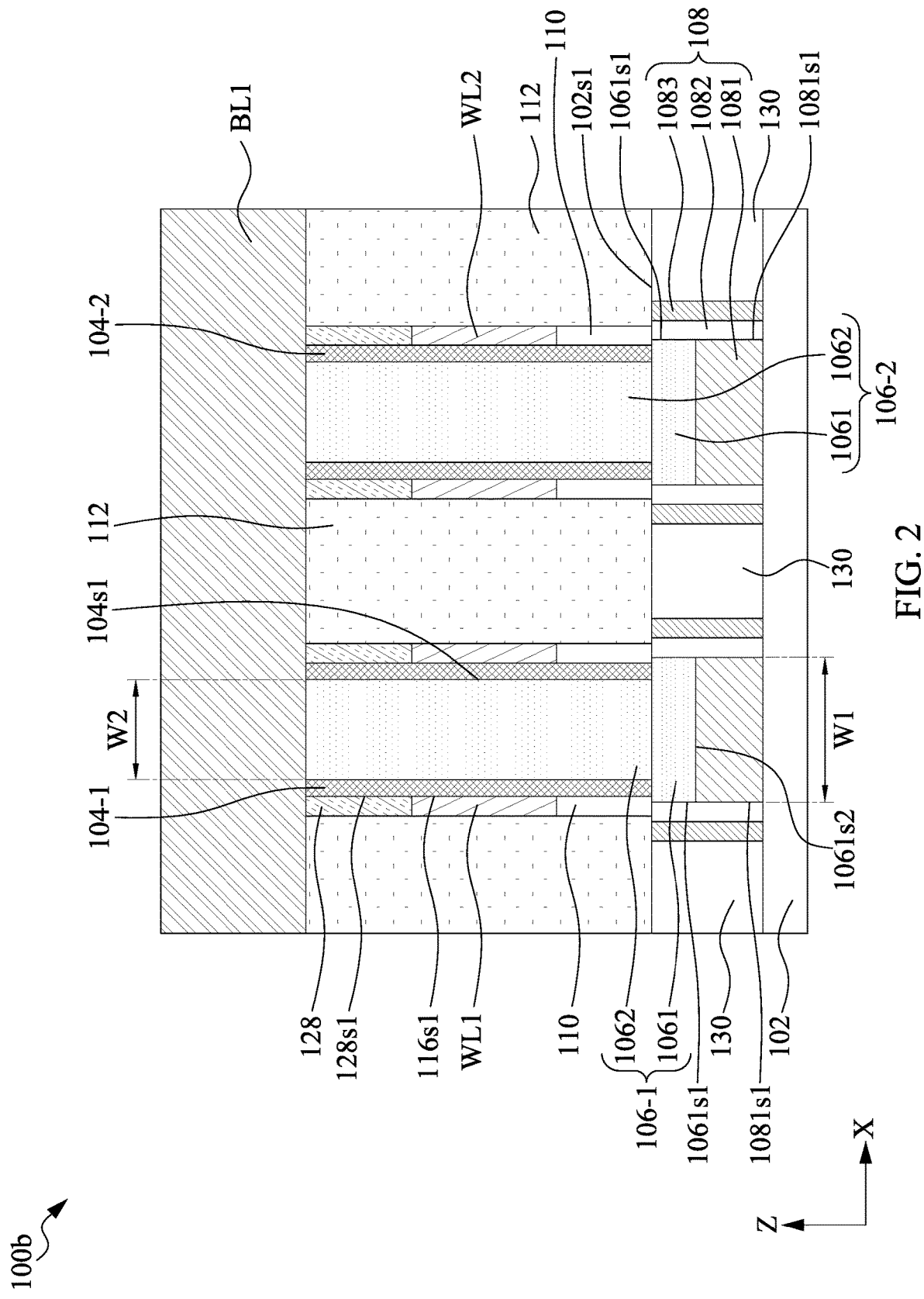
FIG. 2 is a cross-sectional view of a semiconductor device structure, in accordance with some embodiments of the present disclosure.

FIG. 2 is a cross-sectional view of a semiconductor device structure 100b, in accordance with some embodiments of the present disclosure. The semiconductor device structure 100b shown in FIG. 2 can be similar to the semiconductor device structure 100a shown in FIG. 1B, differing in that the semiconductor device structure 100b can include an aperture adjustment component 128.

In some embodiments, the aperture adjustment component 128 can be utilized to define an aperture accommodating the gate dielectric layers 104-1 and 104-2 and the channel layer 106-1 or 106-2. In some embodiments, the aperture adjustment component 128 can be utilized to reduce the width or diameter of the portion 1062 of the channel layers 106-1 and 106-2. In some embodiments, the aperture adjustment component 128 can be utilized to control or modify the width or diameter of the portion 1062 of the channel layers 106-1 and 106-2.

In some embodiments, the aperture adjustment component 128 can be disposed on or over the word line WL1 or WL2. In some embodiments, the aperture adjustment component 128 can be in contact with the word line WL1 or WL2. In other embodiments, the aperture adjustment component 128 can be physically spaced apart from the word line WL1 or WL2 by a dielectric layer, such as silicon oxide. In some embodiments, the aperture adjustment component 128 can have a sidewall 128s1 substantially coplanar with the sidewall 116s1 of the word line WL1 or WL2.

In some embodiments, a roughness of the sidewall 128s1 of the aperture adjustment component 128 is substantially the same as a roughness of the sidewall 116s1 of the word line WL1 or WL2. In some embodiments, the sidewall 128s1 of the aperture adjustment component 128 can be coplanar with the sidewall 116s1 of the word line WL1 or WL2. In some embodiments, the aperture adjustment component 128 can be in contact with the gate dielectric layer 104-1 or 104-2. In some embodiments, the aperture adjustment component 128 can overlap the portion 1061 of the channel layer 106-1 or 106-2 along the Z-axis.

In some embodiments, the aperture adjustment component 128 can overlap the electrode 1081 of the capacitor structure 108 along the Z-axis. In some embodiments, the aperture adjustment component 128 can overlap the insulation layer 1082 of the capacitor structure 108 along the Z-axis. In some embodiments, the aperture adjustment component 128 can be free from overlapping the electrode 1083 of the capacitor structure 108 along the Z-axis. In other embodiments, the aperture adjustment component 128 can overlap the electrode 1083 of the capacitor structure 108 along the Z-axis.

In some embodiments, the aperture adjustment component 128 can include dielectric materials, such as silicon oxide ($SiO_x$), silicon nitride ($Si_xN_y$), silicon oxynitride (SiON), phosphosilicate glass (PSG), borophosphosilicate glass (BPSG). In some embodiments, the aperture adjustment component 128 can include a metal oxide, such as tungsten oxide, zirconium oxide, copper oxide, aluminum oxide, or the like. In some embodiments, the aperture adjustment component 128 can include a photosensitive material, such as a photoresist layer. The photoresist layer can include a negative-tone photoresist (or a negative photoresist). In some embodiments, the aperture adjustment component 128 can be a composite structure. For example, the aperture adjustment component 128 can include a photoresist layer covered by an oxide conformally formed thereon. In some embodiments, the aperture adjustment component 128 can include carbon-containing material.

In some embodiments, the aperture adjustment component 128 can be utilized to reduce the aperture accommodating the gate dielectric layers 104-1 or 104-2 as well as the channel layer 106-1 or 106-2. Further, the aperture adjustment component 128 can serve as a mask during patterning of the word lines WL1 and WL2 in a wet etching or dry etching process. As a result, electrical shorts can be prevented when a high external voltage is imposed on the word line WL1 or WL2, thereby improving the performance of the semiconductor device structure 100b.

Figure 3:
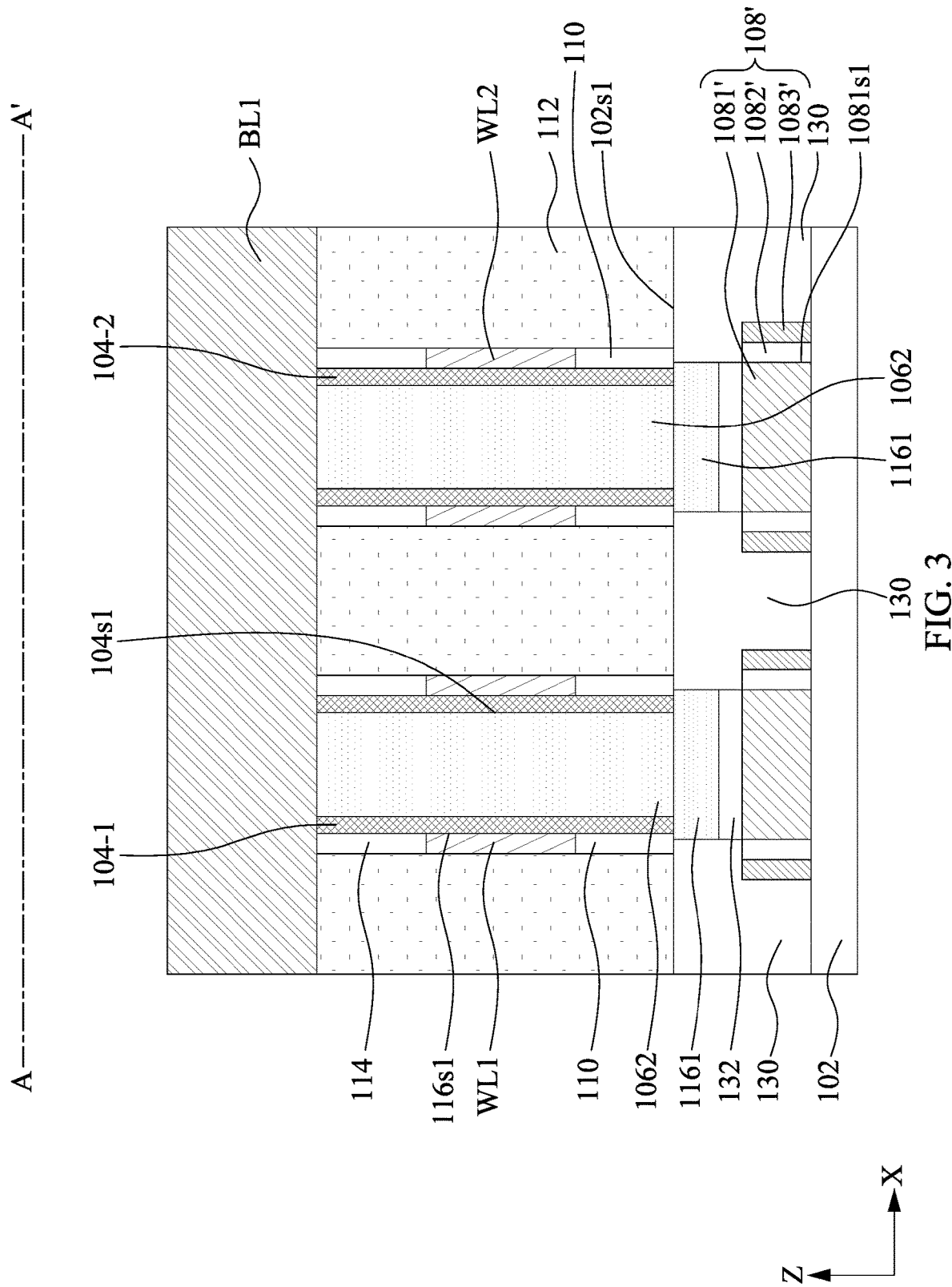
FIG. 3 is a cross-sectional view of a semiconductor device structure, in accordance with some embodiments of the present disclosure.

FIG. 3 is a cross-sectional view of a semiconductor device structure 100c, in accordance with some embodiments of the present disclosure. The semiconductor device structure 100c shown in FIG. 3 can be similar to the semiconductor device structure 100a shown in FIG. 1B, differing in that the semiconductor device structure 100c can include a contact plug 132.

In some embodiments, the contact plug 132 can be embedded in the substrate 102. In some embodiments, the contact plug 132 can be disposed between the capacitor structure 108' and the portion 1062 of the channel layer 106-1 or 106-2. The contact plug 132 can include a conductive material, such as tungsten, copper, aluminum, tantalum, or other suitable materials. In some embodiments, the contact plug 132 can be utilized to electrically connect the capacitor structure 108 and bit line BL1 or BL2. In some embodiments, the contact plug 132 can be utilized to electrically connect the capacitor structure 108 and word line WL1 or WL2.

In some embodiments, the insulation layer 1082 of the capacitor structure 108' can be free from overlapping the contact plug 132 along the Z-axis. In some embodiments, the electrode 1083 of the capacitor structure 108' can be free from overlapping the contact plug 132 along the Z-axis. The contact plug 132 can be utilized to control or tune the size of the electrode 1081, the insulation layer 1082 and/or the electrode 1083 of the capacitor structure 108', optimizing the performance of the semiconductor device structure 100c.

Figure 4:
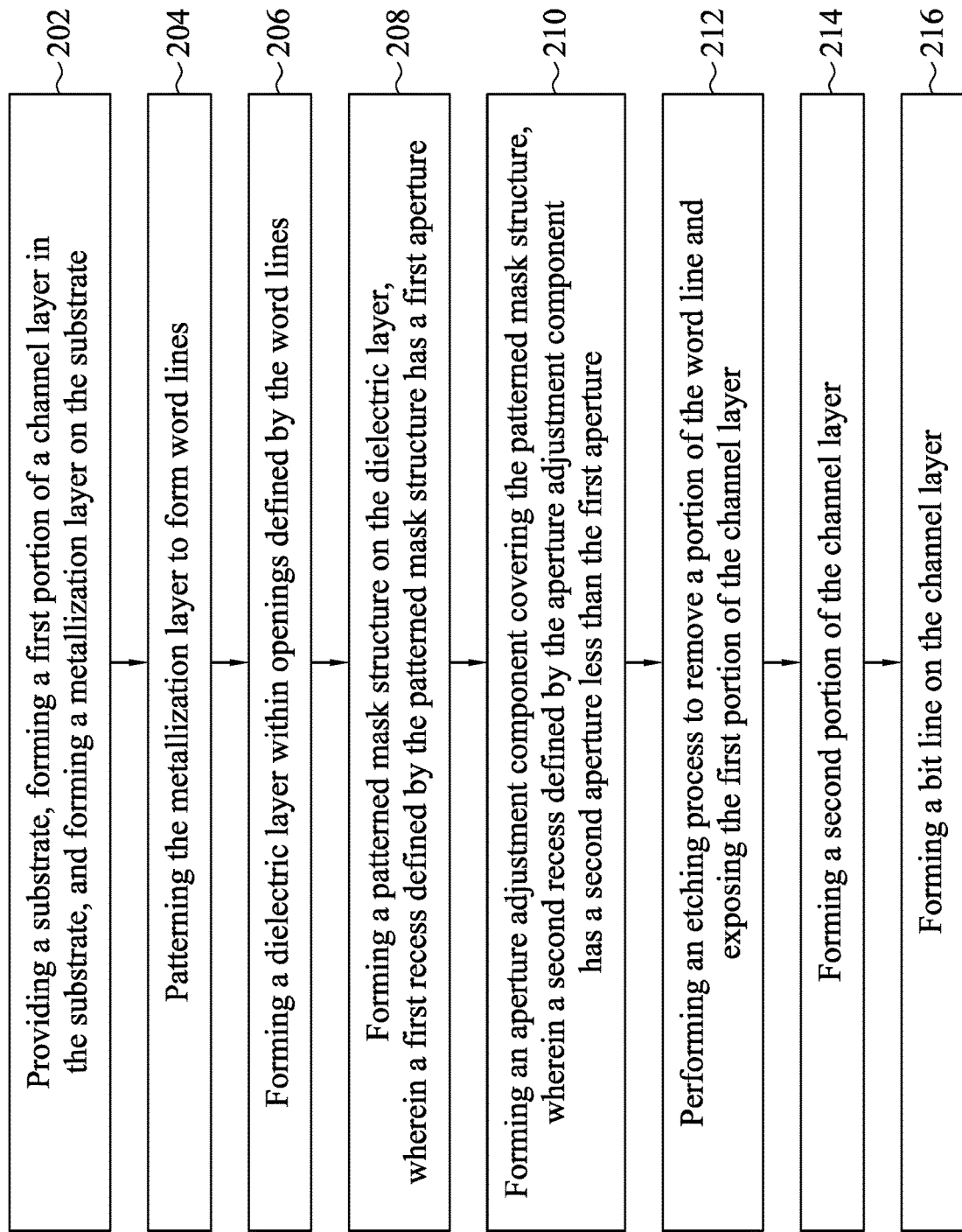
FIG. 4 is a schematic chart illustrating a method of manufacturing a semiconductor device structure, in accordance with some embodiments of the present disclosure.

FIG. 4 is a schematic chart illustrating a method 200 of manufacturing a semiconductor device structure, in accordance with some embodiments of the present disclosure.

The method 200 begins with operation 202 in which a substrate is provided. A first dielectric layer can be formed on the substrate. A metallization layer can be formed on the substrate. The metallization layer can be formed on the first dielectric layer. The metallization layer can be separated from the substrate by the first dielectric layer. A second dielectric layer can be formed on the metallization layer. A capacitor structure can be formed in the substrate. A first portion of a channel layer can be formed in the substrate.

The first portion of a channel layer can be formed between the capacitor structure and the first dielectric layer.

The method 200 continues with operation 204 in which the metallization layer is patterned. An etching process can be performed to etch a portion of the first dielectric layer, the metallization layer, and the second dielectric layer. As a result, a plurality of word lines can be formed. Further, an opening can be formed between the word lines.

The method 200 continues with operation 206 in which a third dielectric layer can be formed within the openings.

The method 200 continues with operation 208 in which a patterned mask structure can be formed on the third dielectric layer. The patterned mask structure can expose the third dielectric layer. The patterned mask structure can be formed by a self-aligned double patterning (SADP) process. The patterned mask structure can include multiple layers. For example, the patterned mask structure can include a mask layer and an anti-reflection coating (ARC) on the mask layer. The patterned mask structure can define a first recess with a first aperture. The first recess can expose the second dielectric layer.

The method 200 continues with operation 210 in which an aperture adjustment component can be conformally formed on the patterned mask structure. The aperture adjustment component can cover the top surface and the lateral surface of the patterned mask structure. The aperture adjustment component can cover the word lines. The aperture adjustment component can define a second recess with a second aperture smaller than the first aperture.

The method 200 continues with operation 212 in which an etching process can be performed to remove a portion of the second dielectric layer, the word line, and the first dielectric layer. The portion of the second dielectric layer, the word line, and the first dielectric layer beneath the second recess can be removed. In some embodiments, the patterned mask structure and the aperture adjustment component can be removed after the etching process is performed. In other embodiments, the aperture adjustment component can remain after the etching process is performed. A trench can be formed to expose the first portion of the channel layer. The aperture of the trench can be determined by controlling the thickness of the aperture adjustment component.

The method 200 continues with operation 214 in which a gate dielectric layer and a second portion of the channel layer can be formed within the trench. The widths or diameters of the first portion and the second portion of the channel layer can be different from each other.

The method 200 continues with operation 216 in which a bit line can be formed on the channel layer. As a result, a semiconductor device structure can be produced.

The method 200 is merely an example, and is not intended to limit the present disclosure beyond what is explicitly recited in the claims. Additional operations can be provided before, during, or after each operation of the method 200, and some operations described can be replaced, eliminated, or moved around for additional embodiments of the method. In some embodiments, the method 200 can include further operations not depicted in FIG. 4. In some embodiments, the method 200 can include one or more operations depicted in FIG. 4.

FIG. 5A, FIG. 6A, FIG. 7A, FIG. 8A, FIG. 9A, FIG. 10A, FIG. 11A, and FIG. 12A illustrate one or more stages of an example of a method for manufacturing a semiconductor device structure according to some embodiments of the present disclosure. FIG. 5B, FIG. 6B, FIG. 7B, FIG. 8B, FIG. 9B, FIG. 10B, FIG. 11B and FIG. 12B are cross-sectional views of FIG. 5A, FIG. 6A, FIG. 7A, FIG. 8A, FIG. 9A, FIG. 10A, FIG. 11A, and FIG. 112, respectively. It should be noted that, for brevity, some elements are illustrated in cross-sectional views but not in top views.

Figure 5A:
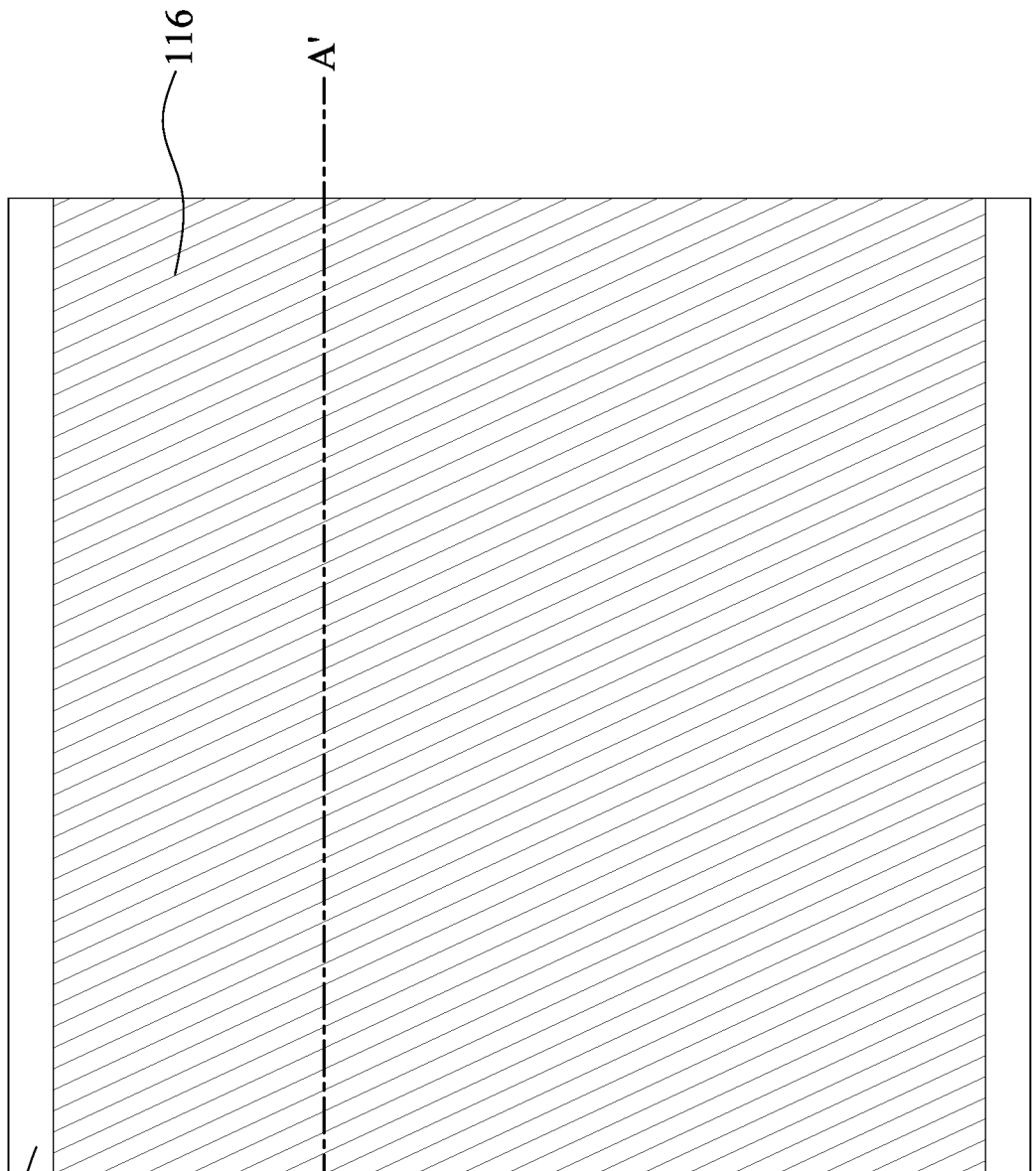
FIG. 5A, FIG. 6A, FIG. 7A, FIG. 8A, FIG. 9A, FIG. 10A, FIG. 11A, and FIG. 12A illustrate one or more stages of an example of a method for manufacturing a semiconductor device structure according to some embodiments of the present disclosure.
Figure 5B:
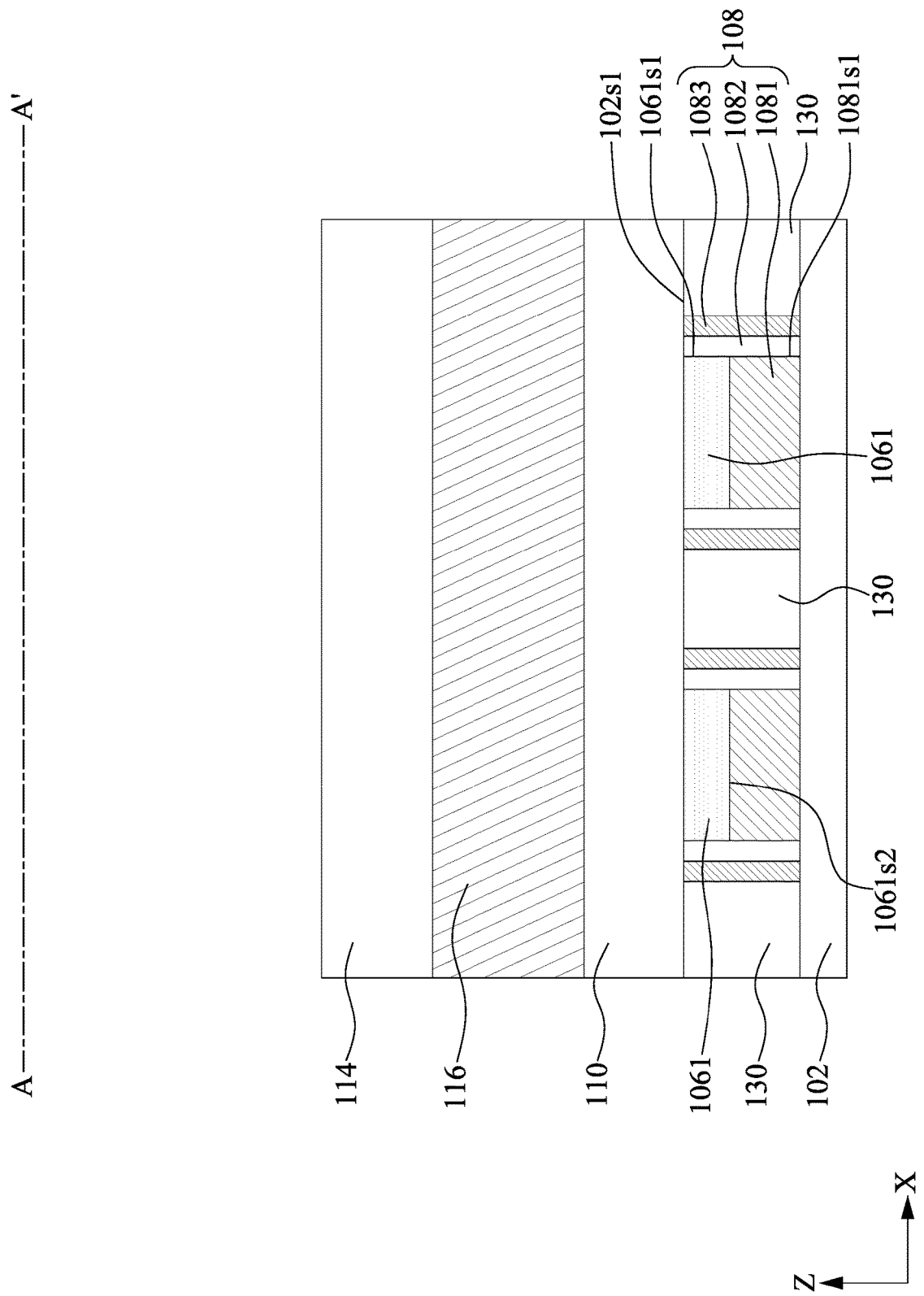
FIG. 5B, FIG. 6B, FIG. 7B, FIG. 8B, FIG. 9B, FIG. 10B, FIG. 11B and FIG. 12B are cross-sectional views along line A-A' of FIG. 5A, FIG. 6A, FIG. 7A, FIG. 8A, FIG. 9A, FIG. 10A, FIG. 11A, and FIG. 12A, respectively.

As shown in FIG. 5A and FIG. 5B, a substrate 102 can be provided. In some embodiments, a capacitor structure 108 can be formed within the substrate 102. In some embodiments, a portion 106I of a channel layer can be formed within the substrate 102. In some embodiments, the portion 106I of a channel layer can be formed on the capacitor structure 108. In some embodiments, a dielectric layer 110 can be formed on the substrate 102. In some embodiments, a metallization layer 116 can be formed on the dielectric layer 110. In some embodiments, a dielectric layer 114 can be formed on the metallization layer 116. The dielectric layer 110 and dielectric layer 114 can be formed by chemical vapor deposition (CVD), atomic layer deposition (ALD), physical vapor deposition (PVD), low-pressure chemical vapor deposition (LPCVD), or other suitable processes. The metallization layer 116 can be formed by sputtering, PVD, or other suitable processes. The capacitor structure 108 can include an electrode 108I, an electrode 108J, and an insulation layer between the electrodes 108I and 108J. In some embodiments, an isolation feature 130 can be formed. A patterning process can be performed to define openings of the isolation feature. The capacitor structure 108 can be formed within the openings defined by the isolation feature 130. The portion 106I of the channel layer can be formed on the capacitor structure 108 and within the openings defined by the isolation feature 130.

Figure 6A:
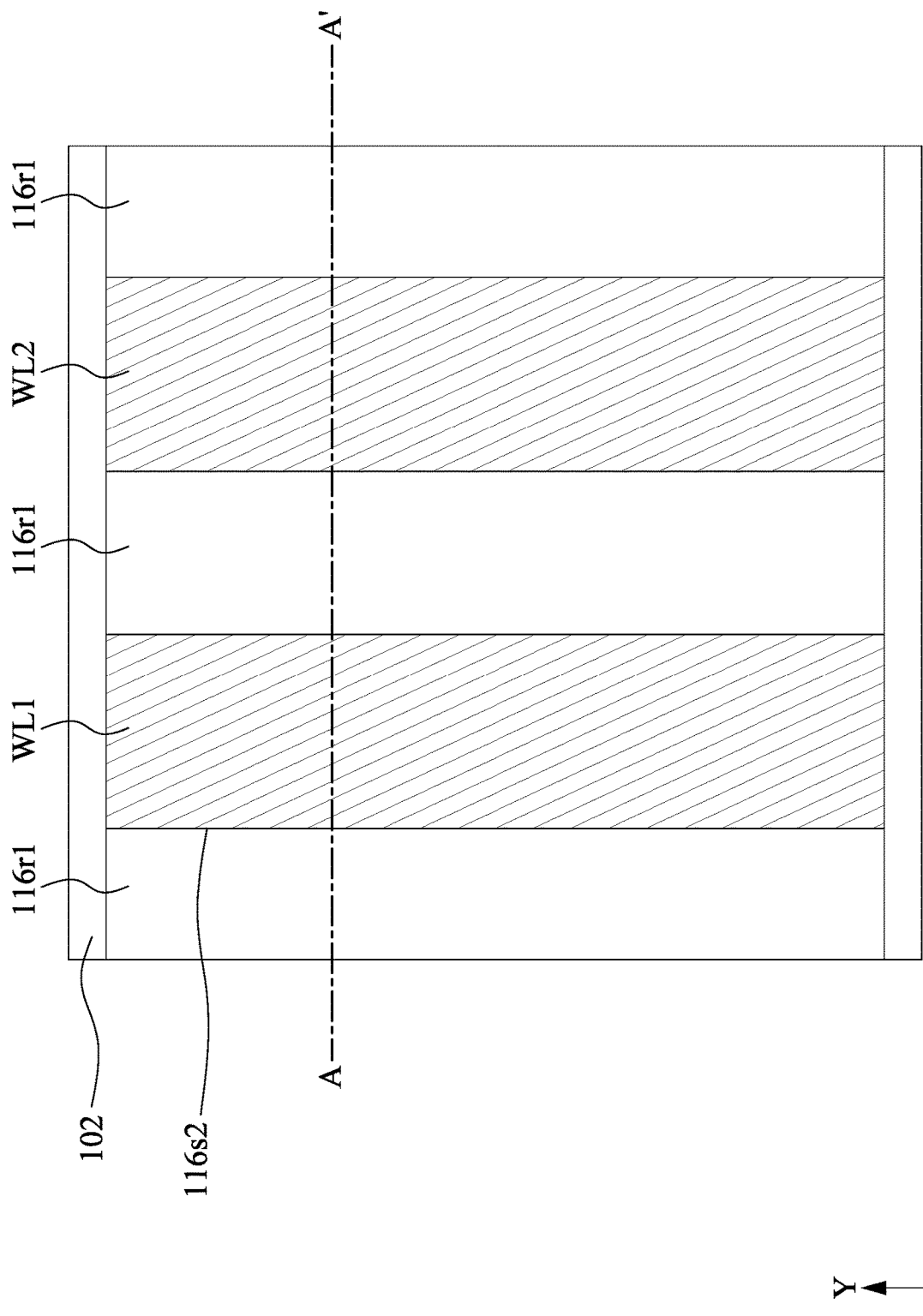
Figure 6B:
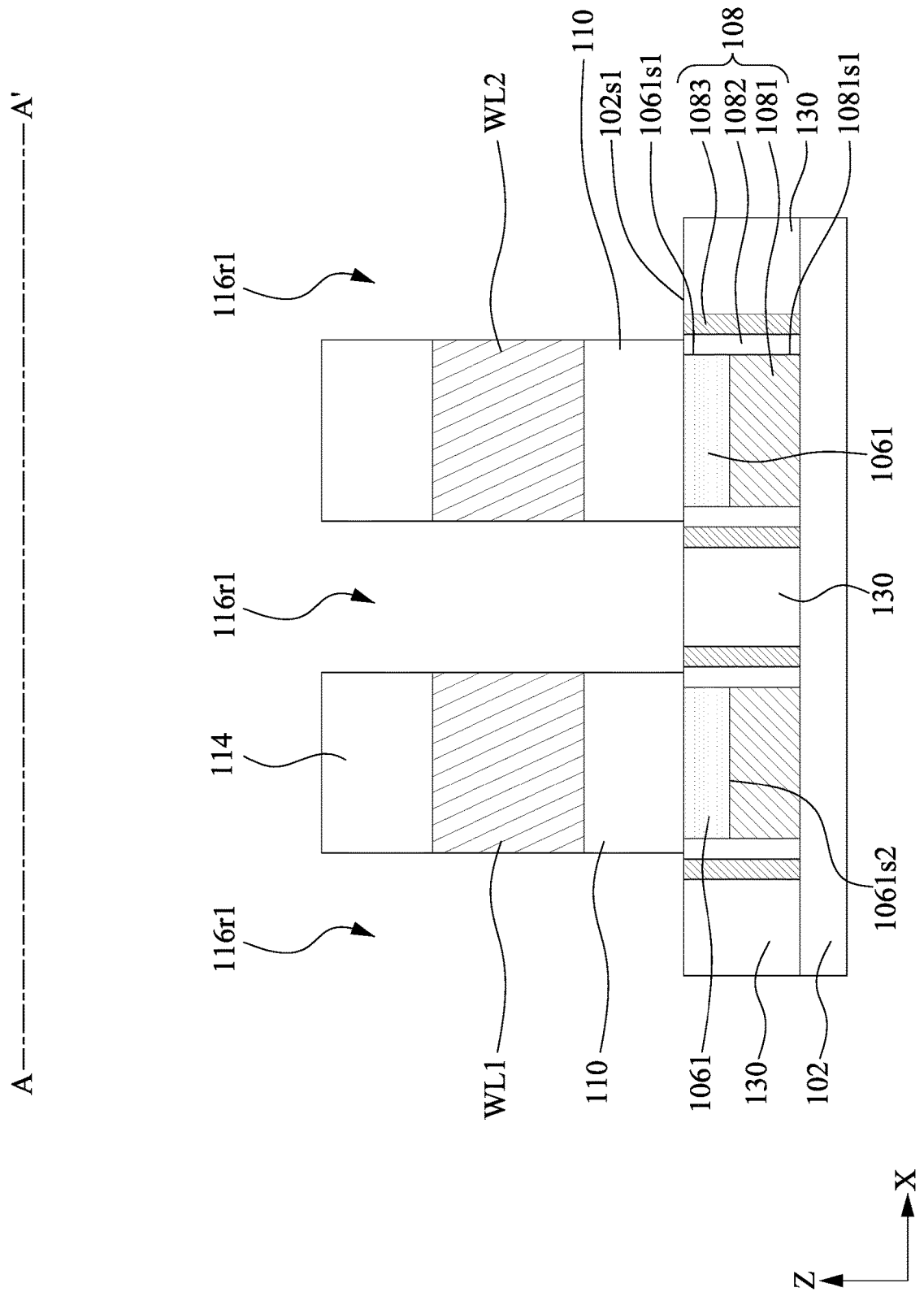

As shown in FIG. 6A and FIG. 6B, a patterning process can be performed to remove a portion of the dielectric layer 110, dielectric layer 112, and metallization layer 116. As a result, word lines WL1 and WL2 are formed. A plurality of openings 116r1 can be formed to expose an upper surface of the substrate 102. The patterning process can include a lithography process, an etching process and other suitable processes. The photolithography process may include photoresist coating (e.g., spin-on coating), soft baking, mask aligning, exposure, post-exposure baking, developing the photoresist, rinsing and drying (e.g., hard baking). The etching process can include, for example, a dry etching process or a wet etching process.

Figure 7A:
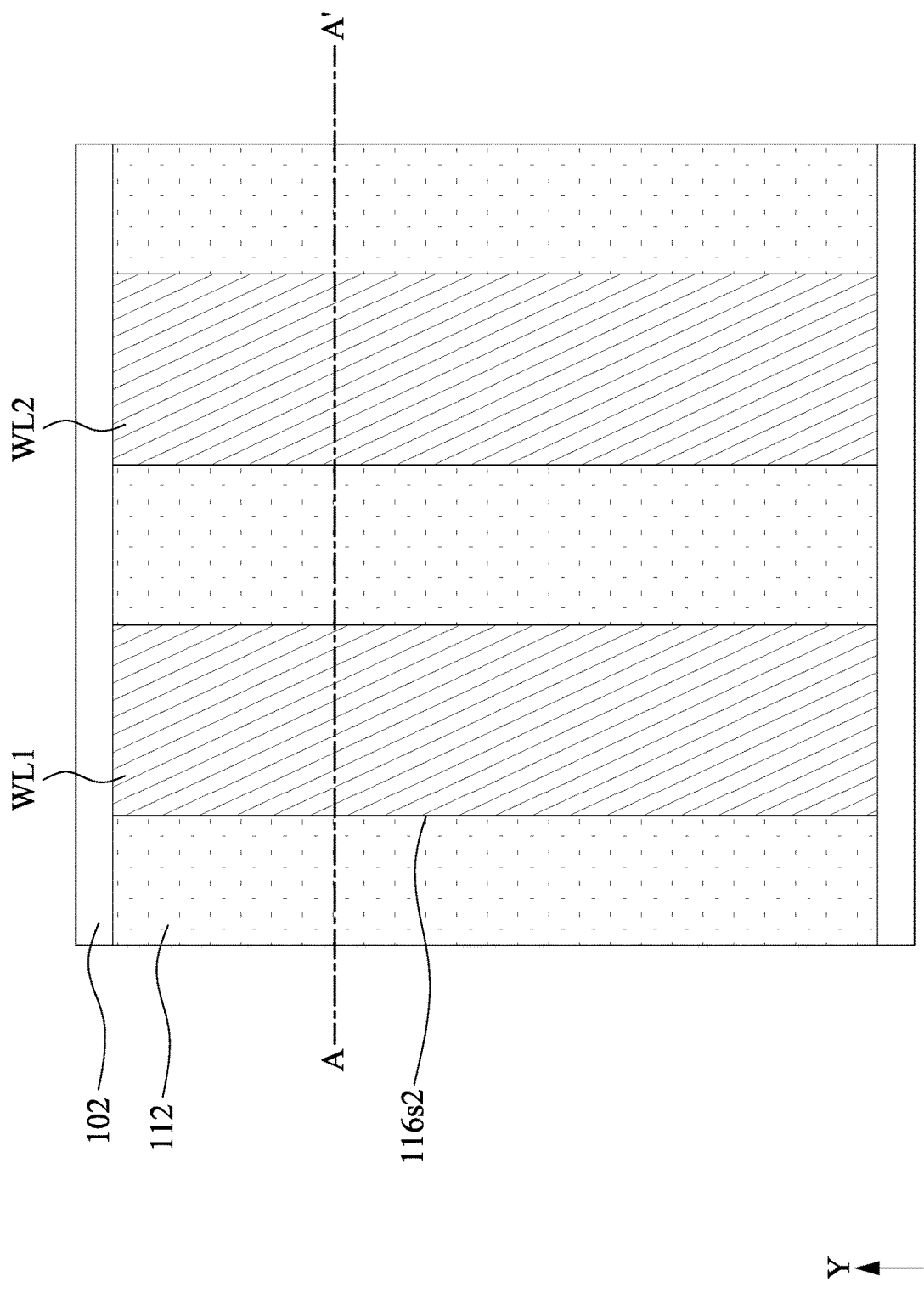
Figure 7B:
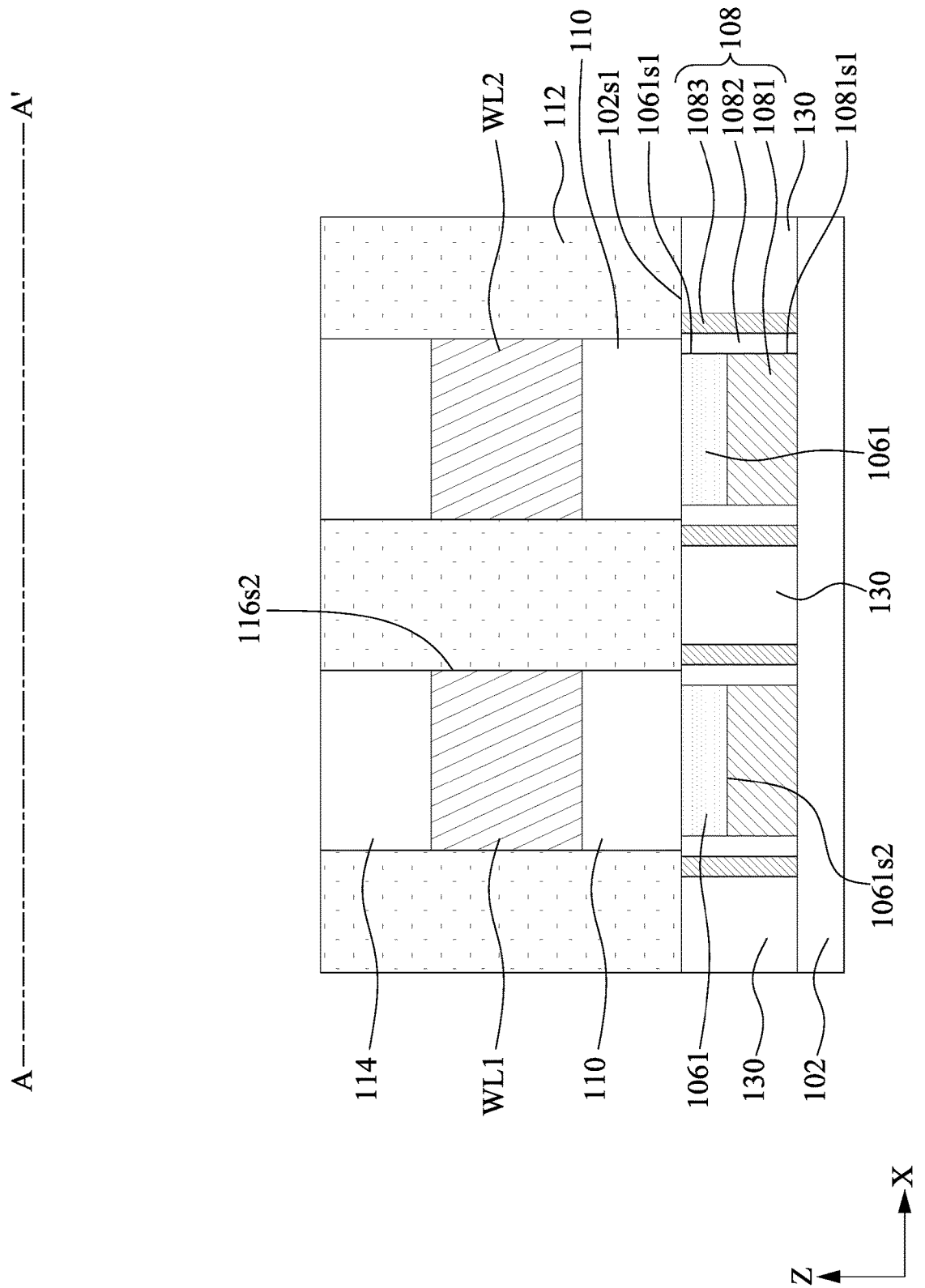

As shown in FIG. 7A and FIG. 7B, a dielectric layer 112 can be formed to fill the openings 116r1. The dielectric layer 112 can be in contact with the sidewall 116s2 of the word line WL1 or WL2. The dielectric layer 112 can be formed by CVD, ALD, PVD, LPCVD, or other suitable processes.

Figure 8A:
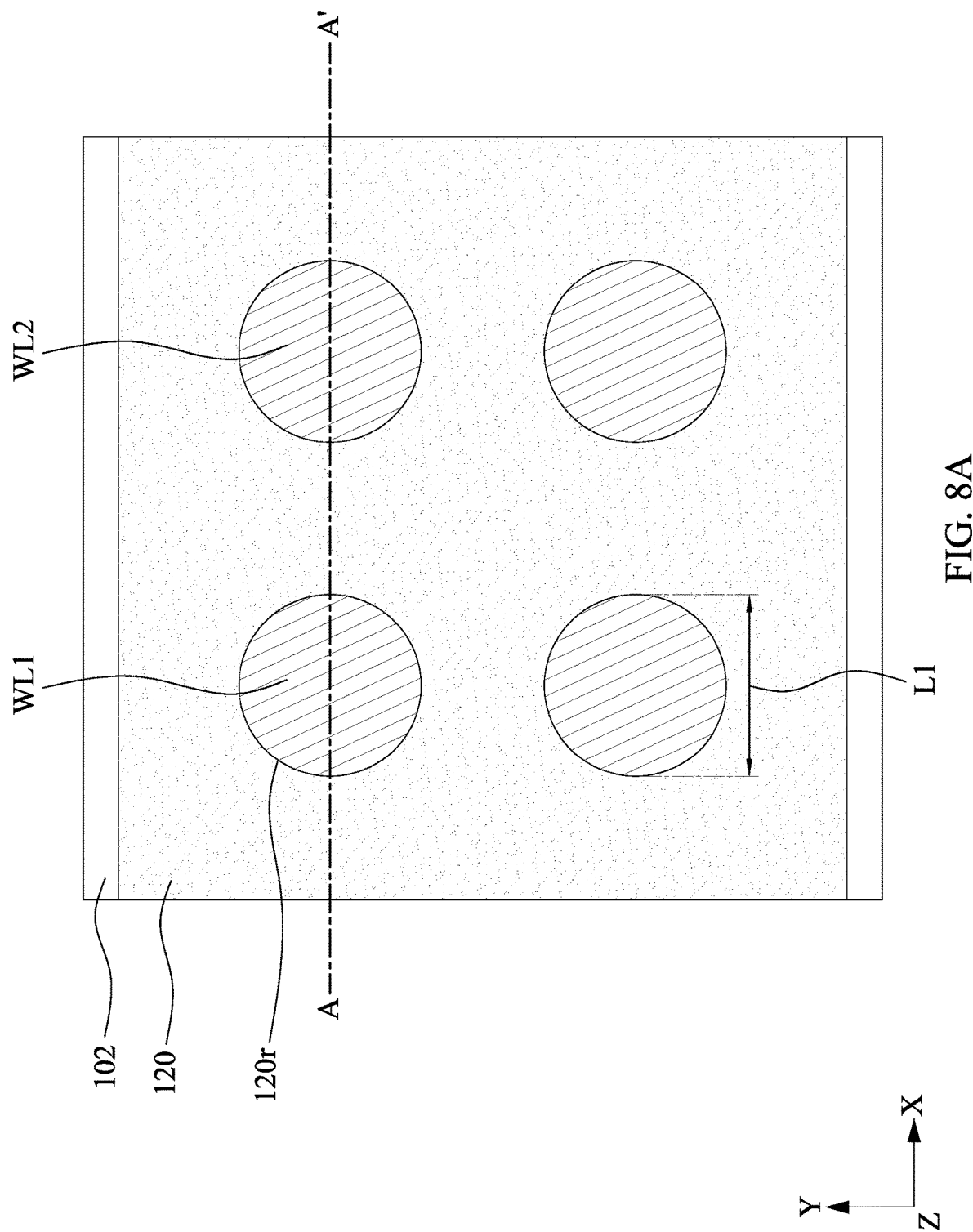
Figure 8B:
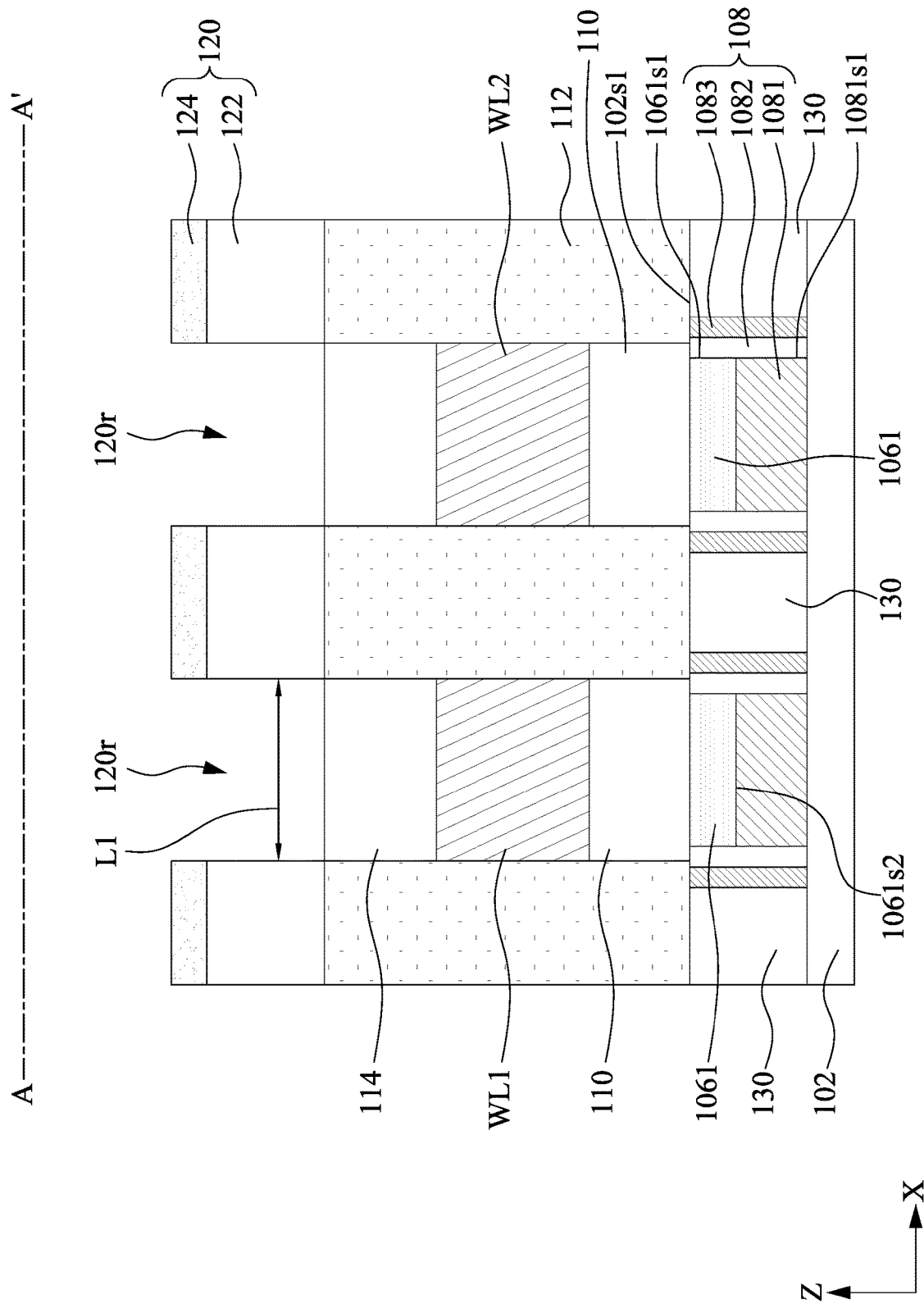

As shown in FIG. 8A and FIG. 8B, a patterned mask structure 120 can be formed on the dielectric layer 112. In some embodiments, the patterned mask structure 120 can cover a portion of the word lines WL1 and WL2.

The patterned mask structure 120 can define a recess 120r exposing the dielectric layer 114. The patterned mask structure 120 can define a recess 120r exposing the word lines WL1 and WL2. The recess 120r can be utilized to define the locations of gate dielectric layers and channel layers subsequently formed. A portion of the word line WL1 or WL2 can be exposed from the patterned mask structure 120. The portion 106I of the channel layer can be exposed from the patterned mask structure 120 along the Z-axis. The recess 120r can have an aperture L1.

In some embodiments, the patterned mask structure 120 can include a mask layer 122 and an ARC layer 124 over the mask layer 122. The mask layer 122 can include, for example, carbon, doped carbon, polymer, or other suitable materials. In some embodiments, the patterned mask structure 120 can be formed by an SADP process. In some embodiments, the SADP process can include forming a first patterned photoresist layer extending along the X-axis. A first spacer can be formed on two sidewalls of the first patterned photoresist layer, and then the first photoresist layer can be removed. Next, a second patterned photoresist layer can be formed on the first spacer and extending along the Y-axis. A second spacer can be formed on two sidewalls of the second patterned photoresist layer, and the second photoresist layer can be removed. The first spacer can intersect with the second spacer at an intersecting region. A third photoresist layer can be formed at the intersecting region. A third spacer can be formed on the sidewalls of the third photoresist layer, and the third photoresist layer can be removed to form an opening corresponding to the locations of the recess 120r.

Figure 9A:
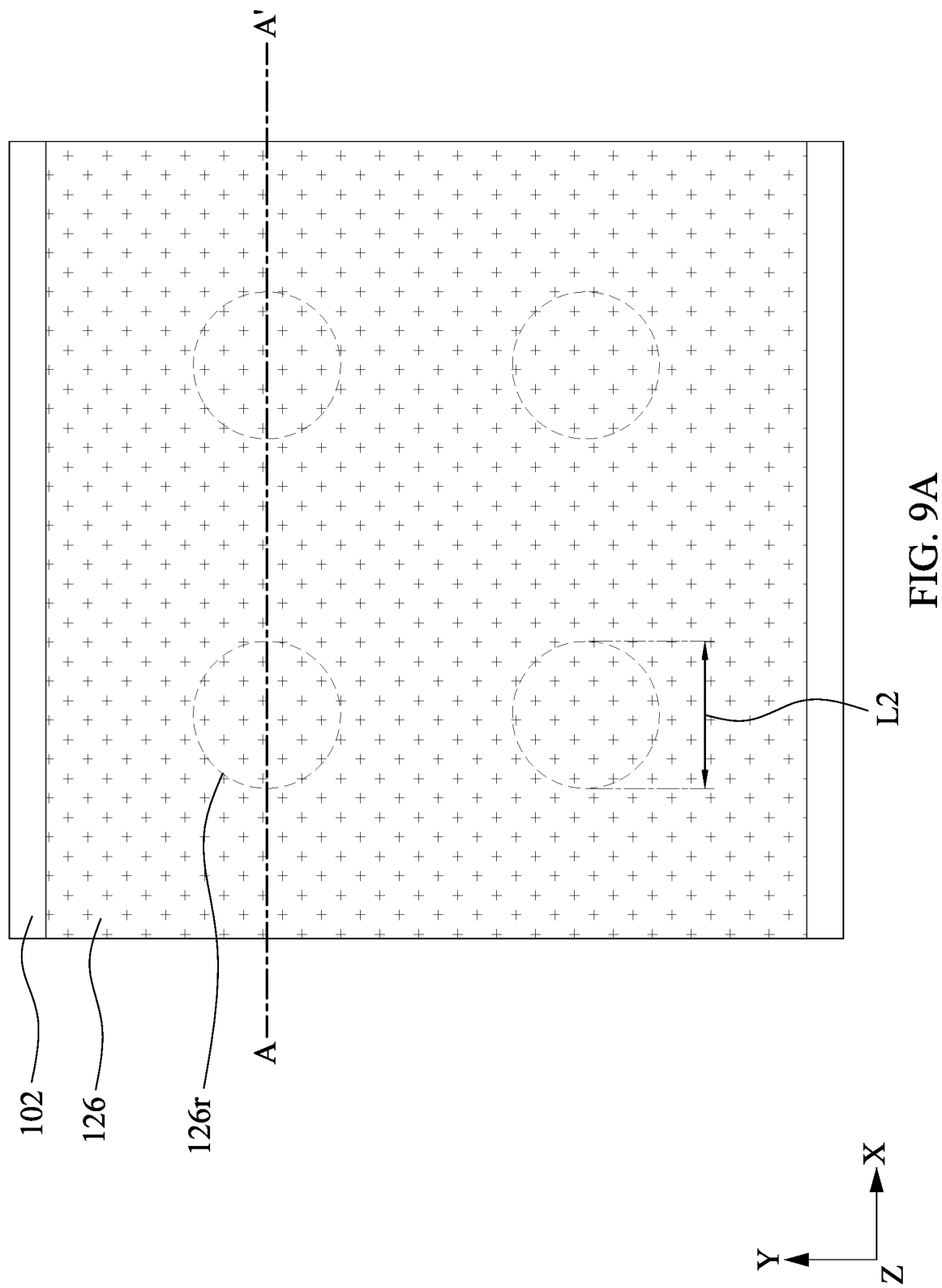
Figure 9B:
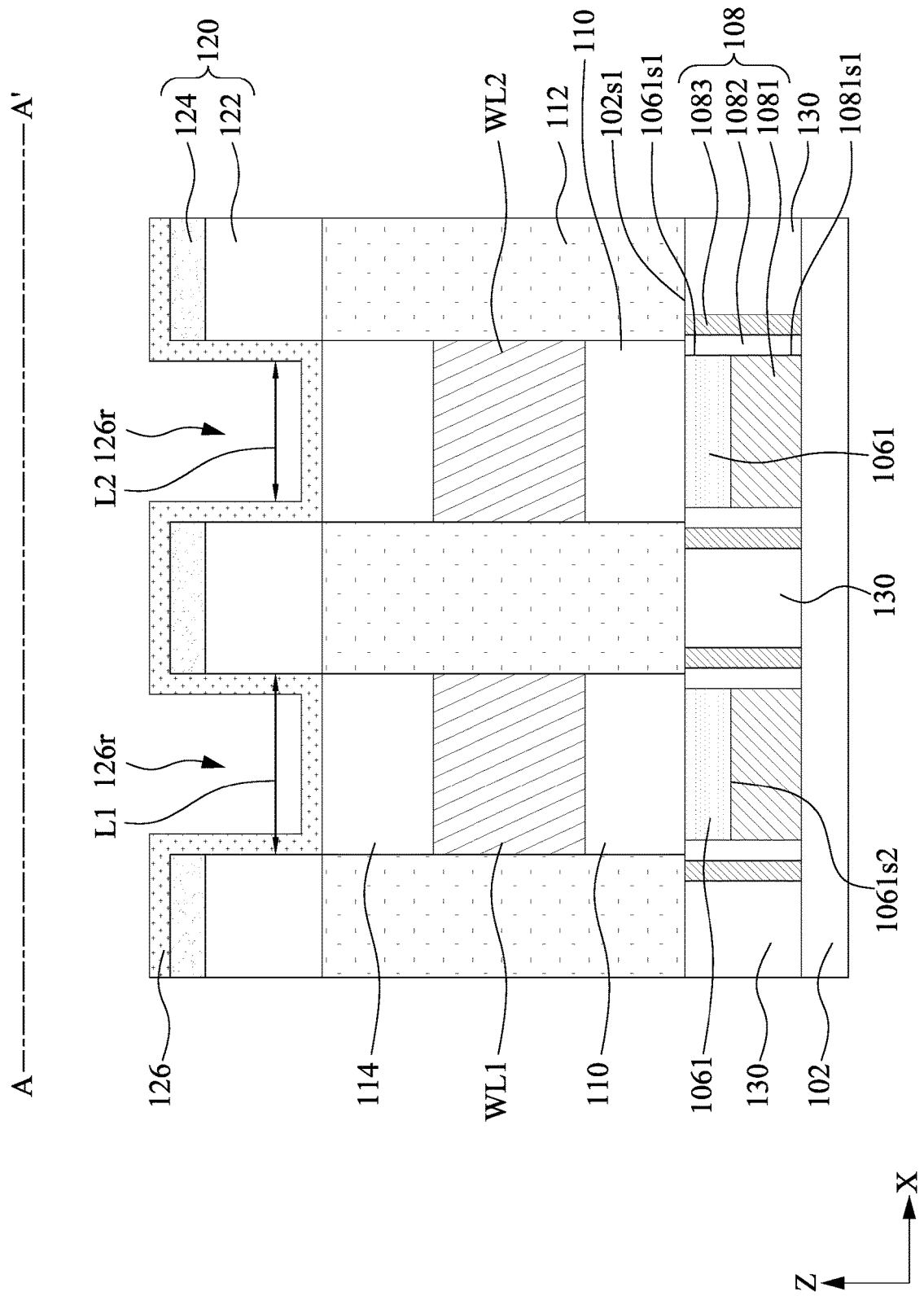

As shown in FIG. 9A and FIG. 9B, an aperture adjustment component 126 can be formed on the patterned mask structure 120. The aperture adjustment component 126 can cover the top surface and the lateral surface of the patterned mask structure 120. In some embodiments, the aperture adjustment component 126 can be formed by, for example, an ALD process. The top surface of the dielectric layer 114 can be covered by the aperture adjustment component 126. The aperture adjustment component 126 can define a recess 126r. The recess 126r can have an aperture L2. In some embodiments, the aperture L1 is greater than the aperture L2.

Figure 10A:
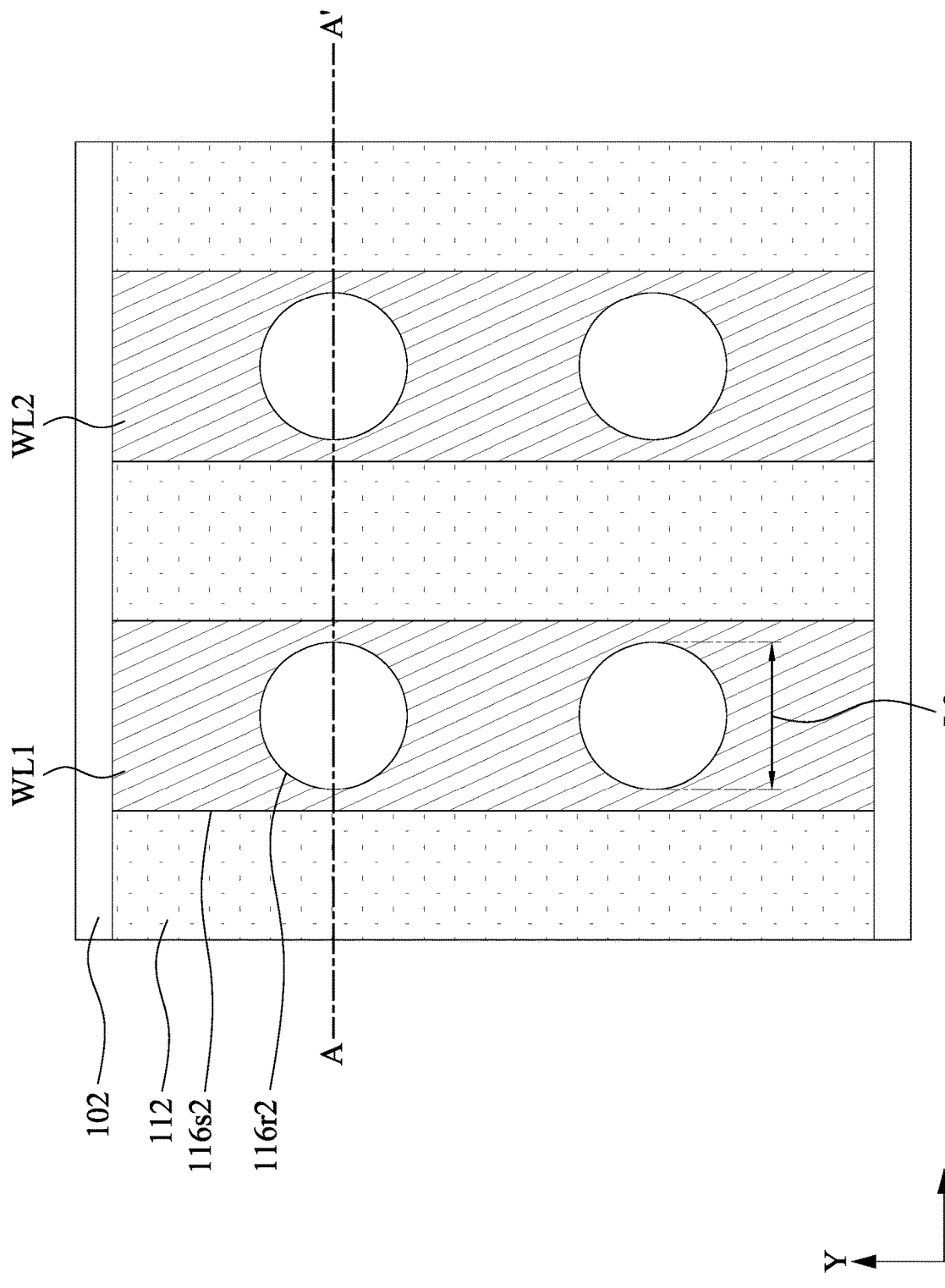
Figure 10B:
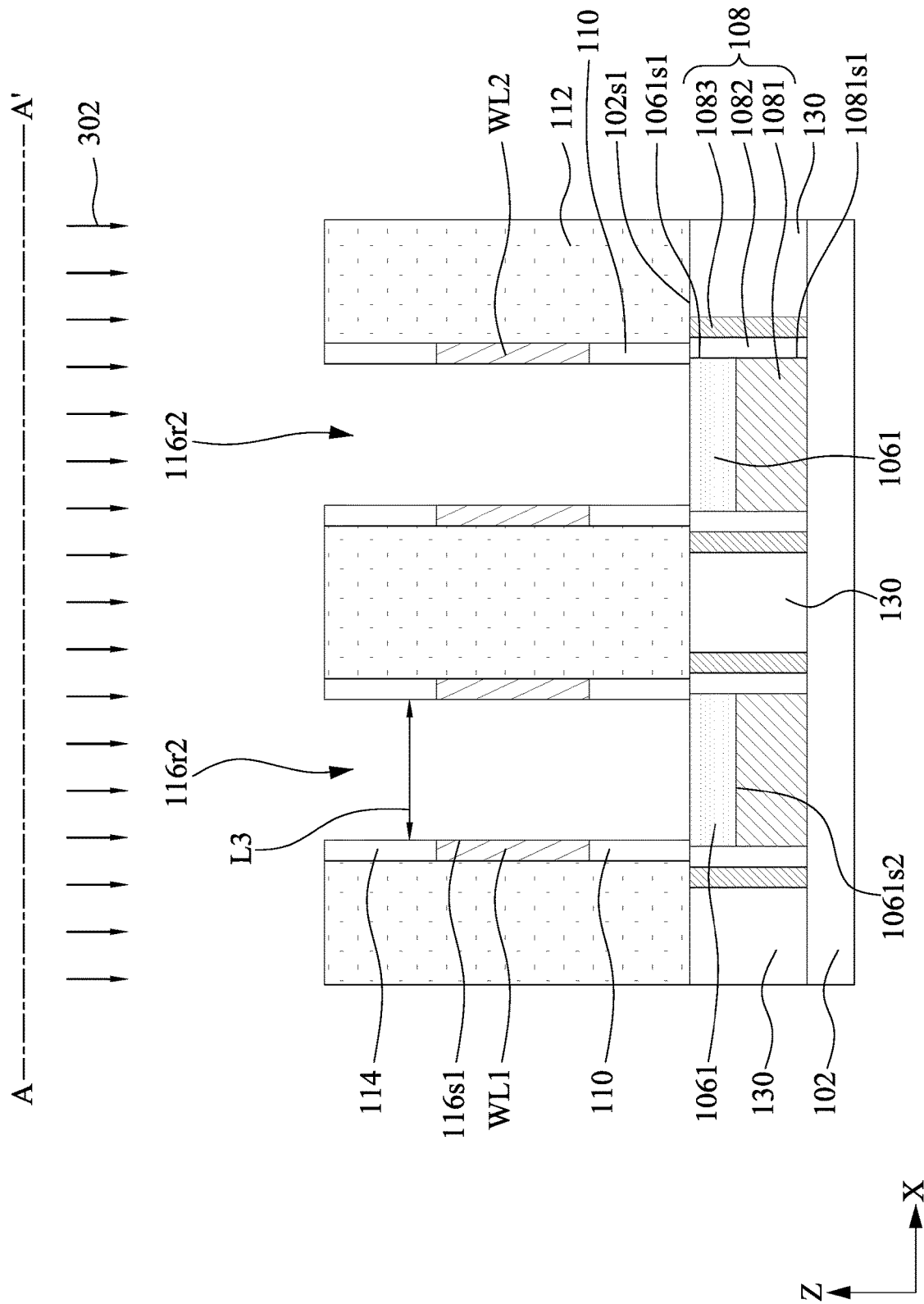

As shown in FIG. 10A and FIG. 10B, an etching process 302 can be performed. A portion of the dielectric layer 114, the word lines WL1 and WL2, and the dielectric layer 110 can be removed. Further, the patterned mask structure 120 and the aperture adjustment component 126 can be removed after the etching process 302 is performed. A trench 116r2 can be formed to expose the portion 1061 of the channel layer. In some embodiments, the aperture L3 of the trench 116r2 can be determined by controlling the thickness of the aperture adjustment component 126. In some embodiments, the etching process 302 can include, for example, a dry etching process. In some embodiments, the etching process 302 can include, for example, an anisotropic etching process.

Figure 11A:
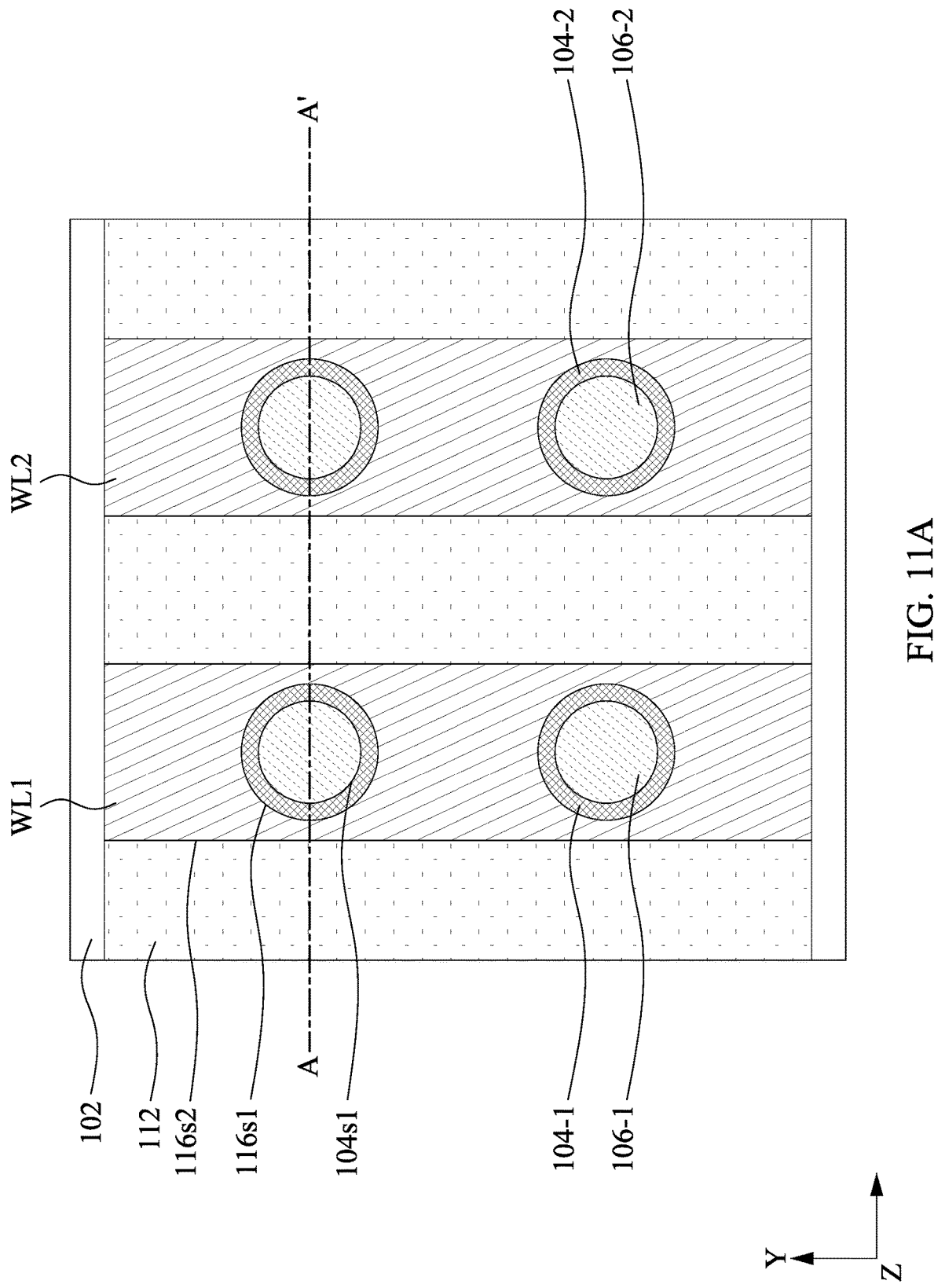
Figure 11B:
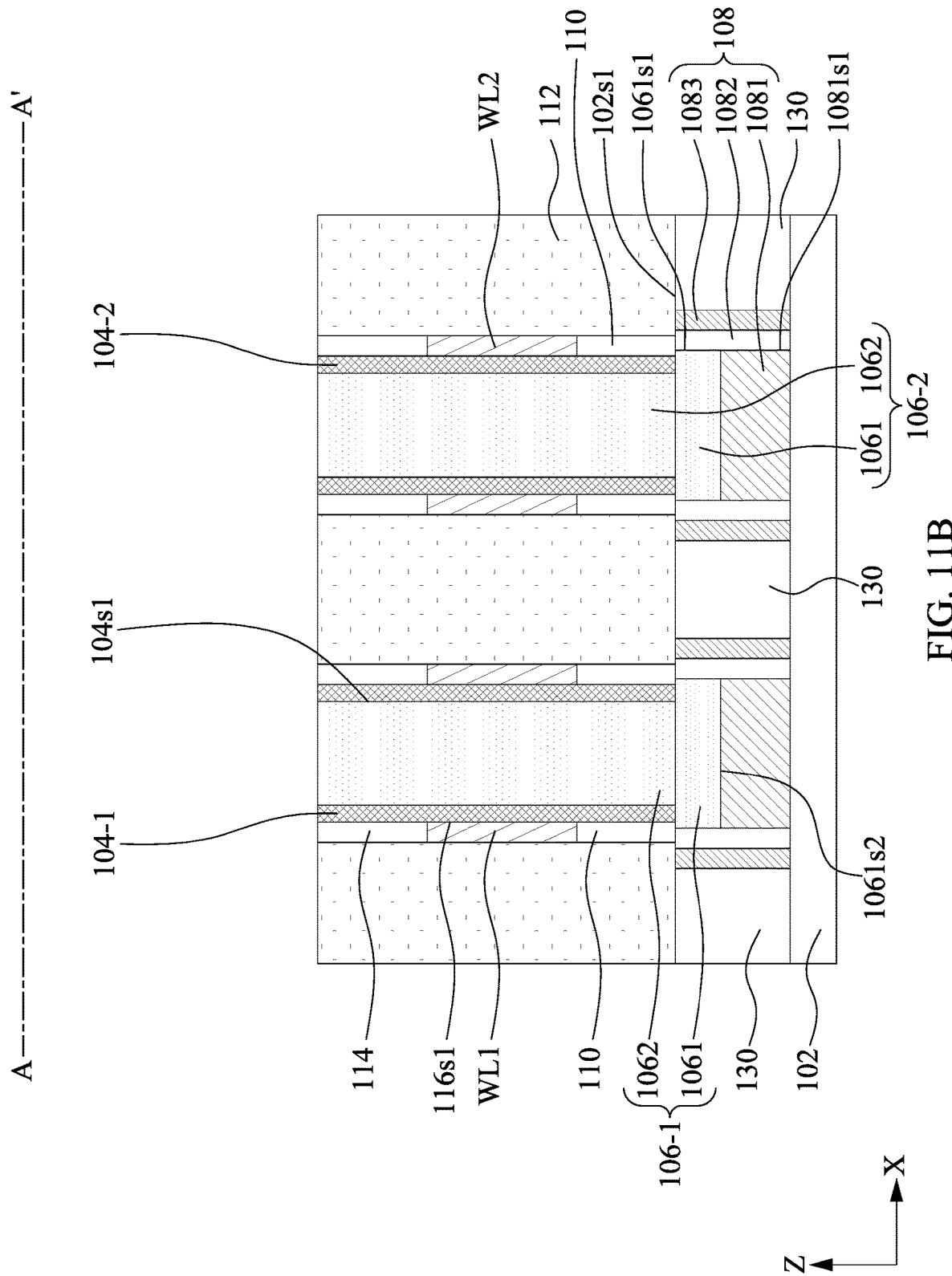

As shown in FIG. 11A and FIG. 11B, gate dielectric layers 104-1 and 104-2 and a portion 1062 of the channel layer can be formed within the trench 116r2. As a result, the channel layers 106-1 and 106-2 can be formed. The gate dielectric layers 104-1 and 104-2 as well as the portion 1062 can be formed by CVD, ALD, PVD, LPCVD, or other suitable processes.

Figure 12A:
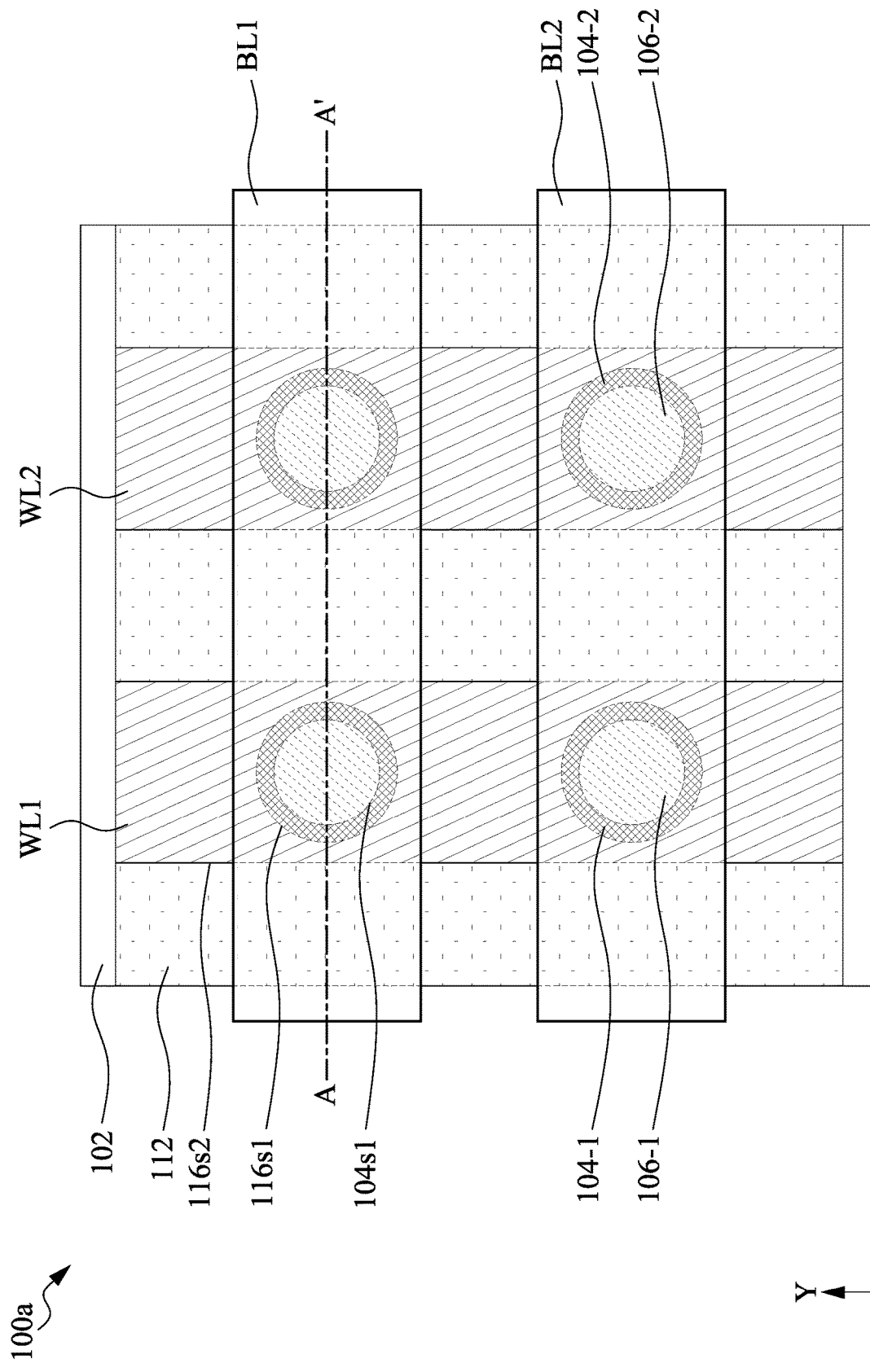
Figure 12B:
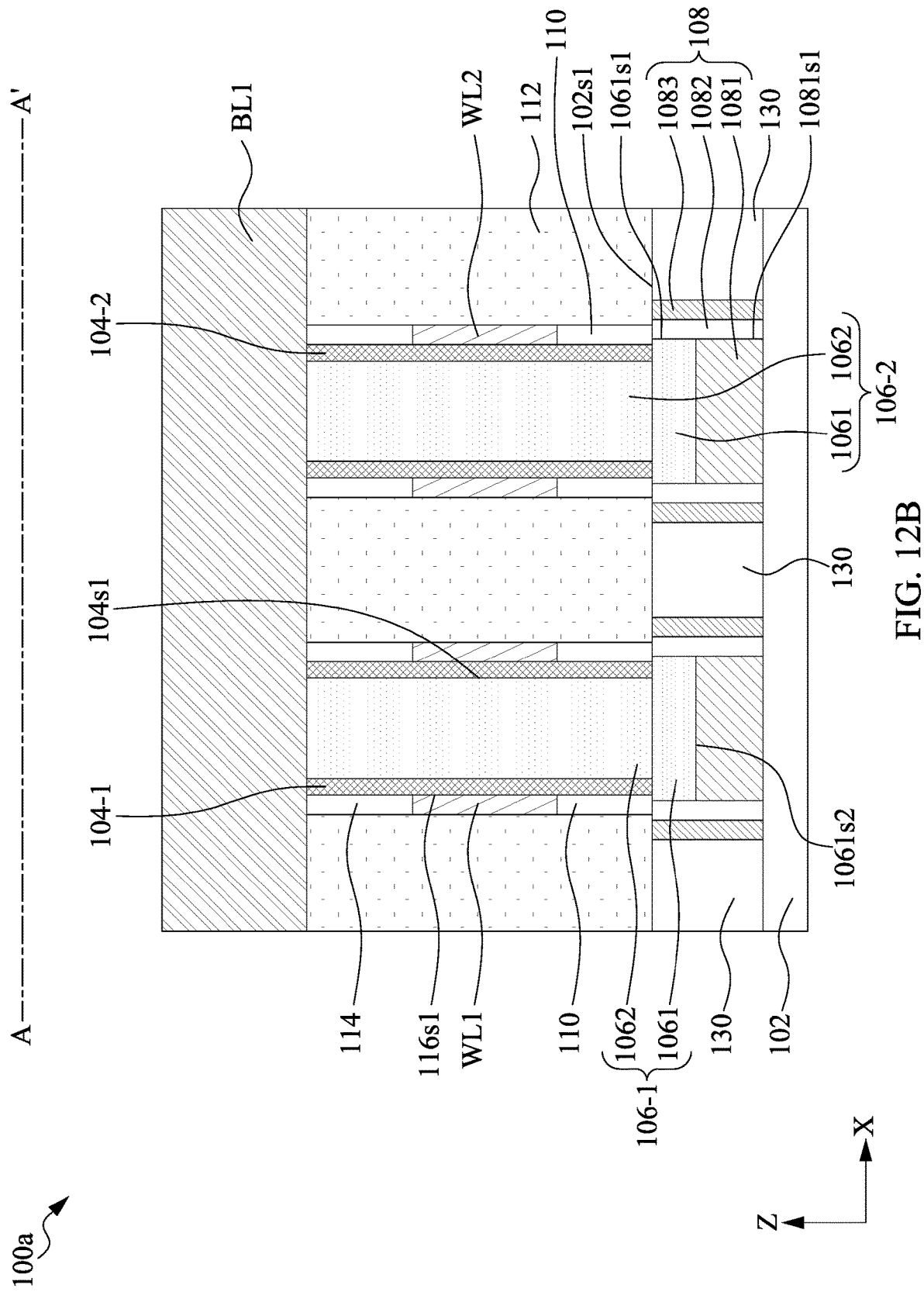

As shown in FIG. 12A and FIG. 12B, bit lines BL1 and BL2 can be formed on the dielectric layer 112, thereby forming the semiconductor device structure 100a. The bit lines BL1 and BL2 can be formed by sputtering, PVD, or other suitable processes.

In comparison with a comparative semiconductor device structure, the gate dielectric layer and/or the channel layer is formed within a word line without an aperture adjustment component. In some situations, when the lithography process has a relatively great overlay error, the boundary of the word line may be removed, causing the deposited channel layer to exceed the boundary of the word line. As a result, when an external voltage is imposed on the word line, the bit line may not respond to electrical signals of the word line. In this embodiment, an aperture adjustment component is utilized to reduce the aperture of the recess of the patterned mask structure. The patterned mask structure can assist in reducing the size of the channel layer. As a result, electrical shorts can be prevented when a high external voltage is imposed on the word line WL1 or WL2, thereby improving the performance of the semiconductor device structure 100a.

One aspect of the present disclosure provides a semiconductor device structure. The semiconductor device structure includes a substrate, a word line, a channel layer, and a bit line. The word line is disposed on the substrate. The channel layer is surrounded by the word line. The bit line is disposed on the channel layer. The channel layer has a first portion in the substrate and a second portion over the substrate. A first width of the first portion is greater than a second width of the second portion along a first direction.

Another aspect of the present disclosure provides another semiconductor device structure. The semiconductor device structure includes a substrate, a word line, a bit line, a channel layer, and an aperture adjustment component. The word line is disposed on the substrate. The bit line is disposed on the word line and physically spaced apart from the word line. The channel layer extends between the substrate and the bit line. The aperture adjustment component is disposed between the word line and the bit line. The aperture adjustment component has a sidewall substantially coplanar with a sidewall of the word line.

Another aspect of the present disclosure provides a method for manufacturing a semiconductor device structure. The method includes: providing a substrate; forming a first portion of the channel layer in the substrate; forming a word line over the substrate; forming a patterned mask structure over the word line, wherein the patterned mask structure defines a first recess with a first aperture, wherein the first recess is vertically aligned to the first portion of a channel layer; forming an aperture adjustment component covering the patterned mask structure, wherein the aperture adjustment component defines a second recess with a second aperture smaller than the first aperture; performing an etching process to form a trench defined by the word line; and forming a second portion of the channel layer within the trench.

The embodiments of the present disclosure provide a semiconductor device structure with a channel layer physically spaced apart from the word line. An aperture adjustment component can be utilized to assist in preventing electrical shorts between the channel layer and the word line, while the size of the channel layer can be reduced. As a result, the performance of the semiconductor device structure can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A semiconductor device structure, comprising:
   a substrate;
   a word line disposed on the substrate;
   a channel layer surrounded by word line; and
   a bit line disposed on the channel layer,
   wherein the channel layer has a first portion in the substrate and a second portion over the substrate, a first width of the first portion is greater than a second width of the second portion along a first direction.

2. The semiconductor device structure of claim 1, further comprising:
   a capacitor structure embedded in the substrate, wherein the capacitor structure is electrically connected to the bit line through the channel layer.

3. The semiconductor device structure of claim 2, wherein the capacitor structure comprises a first electrode, a second electrode, and an insulation layer between the first electrode and the second electrode, and wherein the second electrode surrounds the first electrode.

4. The semiconductor device structure of claim 3, wherein a lateral surface of the first electrode is substantially coplanar with a lateral surface of the first portion of the channel layer.

5. The semiconductor device structure of claim 3, further comprising:
   a gate dielectric layer disposed between the channel layer and the word line, wherein the gate dielectric layer overlaps the first portion of the channel layer along a second direction substantially perpendicular to the first direction.

6. The semiconductor device structure of claim 5, wherein the gate dielectric layer overlaps the first electrode of the capacitor structure along the second direction.

7. The semiconductor device structure of claim 5, wherein the gate dielectric layer is free from overlapping the second electrode of the capacitor structure along the second direction.

8. The semiconductor device structure of claim 5, wherein the gate dielectric layer is free from overlapping the insulation layer of the capacitor structure along the second direction.

9. The semiconductor device structure of claim 3, wherein the insulation layer of the capacitor structure is in contact with a lateral surface of the first portion of the channel layer.

10. The semiconductor device structure of claim 1 wherein the second electrode of the capacitor structure overlaps the first portion of the channel layer along the first direction.

11. The semiconductor device structure of claim 1, further comprising:
    an aperture adjustment component disposed between the word line and the bit line.

12. The semiconductor device structure of claim 11, wherein the aperture adjustment component has a sidewall substantially coplanar with a sidewall of the word line.

13. The semiconductor device structure of claim 12, wherein a roughness of the sidewall of the aperture adjustment component is substantially the same as that of the sidewall of the word line.

14. A semiconductor device structure, comprising:
    a substrate;
    a word line disposed on the substrate;
    a bit line disposed on the word line and physically spaced apart from the word line;
    a channel layer extending between the substrate and the bit line; and
    an aperture adjustment component disposed between the word line and the bit line, wherein the aperture adjustment component has a sidewall substantially coplanar with a sidewall of the word line.

15. The semiconductor device structure of claim 14, wherein a roughness of the sidewall of the aperture adjustment component is substantially the same as that of the sidewall of the word line.

16. The semiconductor device structure of claim 15, further comprising:
    a capacitor structure embedded in the substrate, wherein the capacitor structure is electrically connected to the bit line through the channel layer.

17. The semiconductor device structure of claim 16, wherein the capacitor structure comprises a first electrode, a second electrode, and an insulation layer between the first electrode and the second electrode, and wherein the second electrode surrounds the first electrode.

18. The semiconductor device structure of claim 17, further comprising:
    a gate dielectric layer disposed between the channel layer and the word line, wherein the gate dielectric layer is surrounded by the aperture adjustment component.

19. The semiconductor device structure of claim 18, wherein the gate dielectric layer overlaps the first electrode of the capacitor structure along the second direction.

20. A method of manufacturing a semiconductor device structure, comprising:
    providing a substrate;
    forming a first portion of a channel layer in the substrate;
    forming a word line over the substrate;
    forming a patterned mask structure exposing the word line, wherein the patterned mask structure defines a first recess with a first aperture, wherein the first recess is vertically aligned to the first portion of the channel layer;
    forming an aperture adjustment component covering the patterned mask structure, wherein the aperture adjustment component defines a second recess with a second aperture smaller than the first aperture;
    performing an etching process to form a trench defined by the word line; and
    forming a second portion of the channel layer within the trench.

* * * * *